US012707797B2

(12) United States Patent
Kim et al.

(10) Patent No.: US 12,707,797 B2
(45) Date of Patent: Aug. 11, 2026

(54) DISPLAY DEVICE

(71) Applicant: LG Display Co., Ltd., Seoul (KR)

(72) Inventors: YongCheol Kim, Paju-si (KR); Hyunsook Jeon, Paju-si (KR); Eunhyung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/796,000

(22) Filed: Aug. 6, 2024

(65) Prior Publication Data

US 2025/0248200 A1 Jul. 31, 2025

(30) Foreign Application Priority Data

Jan. 31, 2024 (KR) ........................ 10-2024-0015325

(51) Int. Cl.

| | |
|---|---|
| ***H10K 39/34*** | (2026.01) |
| ***G06F 3/044*** | (2006.01) |
| ***G09G 3/3233*** | (2016.01) |
| ***H10K 59/40*** | (2023.01) |

(52) U.S. Cl.

CPC ........... *H10K 39/34* (2023.02); *G06F 3/0446* (2019.05); *G09G 3/3233* (2013.01); *H10K 59/40* (2023.02); *G09G 2300/0426* (2013.01); *G09G 2300/0842* (2013.01)

(58) Field of Classification Search

CPC ......... G09G 3/3233; G09G 2300/0426; G09G 2300/0842; G06F 3/0446; H10K 39/34; H10K 59/40

See application file for complete search history.

(56) References Cited

U.S. PATENT DOCUMENTS

2010/0007268 A1* 1/2010 Kim ........................ H10K 59/60 313/504
2014/0299879 A1* 10/2014 Yamazaki ............. G06F 1/1616 257/53
2020/0411608 A1* 12/2020 Tang ...................... G06F 3/0446
2021/0233975 A1* 7/2021 Bouthinon .............. G06F 3/042
2022/0367582 A1* 11/2022 Wang ................... H10K 59/875
2023/0118413 A1* 4/2023 Choi ...................... G06F 3/0446 257/175
2023/0134963 A1* 5/2023 Bok ....................... G06F 3/0443 345/174
2023/0259238 A1* 8/2023 Kim ................... G06V 40/1318 345/173
2024/0138241 A1* 4/2024 Park ...................... G06F 3/0418

* cited by examiner

*Primary Examiner* — Hong Zhou

(74) *Attorney, Agent, or Firm* — Seed Intellectual Property Law Group LLP

(57) ABSTRACT

The present disclosure provides to a display device including an optical sensor. The optical sensor includes an optical sensor anode electrode that is electrically connected to a touch sensor. In some embodiments, the optical sensor anode electrode is identical to a pixel anode electrode. The display device according to the present disclosure thereby, provides an advantage of representing resolution uniformly across the entire display area even when the optical sensor is disposed in the display area.

18 Claims, 24 Drawing Sheets

DISPLAY DEVICE

CROSS-REFERENCE TO RELATED APPLICATION

This application claims the priority benefit of Republic of Korea Patent Application No. 10-2024-0015325, filed on Jan. 31, 2024 in the Korean Intellectual Property Office, which is incorporated herein by reference for all purposes as if fully set forth herein.

BACKGROUND

Technical Field

The present disclosure relates to electronic devices, and more specifically, to display devices.

Description of the Related Art

As the information-oriented society has been developed, various needs for display devices for displaying images have increased. Recently, various types of display devices, such as liquid crystal display (LCD) devices, organic light emitting diode (OLED) display devices, and the like have been developed and widely used.

Display devices increasingly employ a touch-based input function that enables users to easily input information or a command to the display devices in an intuitive and convenient manner, in addition to a function of displaying images or data.

Further, display devices increasingly employ a sensing function that senses ambient light and enables operations to be performed or outputs to be adjusted based on the sensed ambient light. To provide these functions, display devices may need to include an optical electronic device, such as a camera, a sensor, and the like.

BRIEF SUMMARY

To effectively receive light incident on a display device, such an optical electronic device may be desired to be located in an area where incident light can be increasingly received and detected. As one example, an optical electronic device may be exposed from the front of a display device or be located in an area with a low density of subpixels.

To receive or detect incident light and perform an intended function, as the optical electronic device is disposed in the display device according to this example, a size of the bezel in the front portion of the display device may be increased, and the resolution of the area with such a low density of subpixels may be reduced. In addition, a substantial disadvantage may be encountered in designing the front portion of the display device. Thus, in a case where an optical sensor is disposed in the front of a display device to receive or detect light incident on the front thereof, the display device has suffered from the problem of forcing an area where the optical sensor is disposed to be designed to have a low density of subpixels or have no subpixels.

To solve the various technical problems in the related art, including the problem identified above, the present inventors have provided various embodiments of a display device configured to allow an optical sensor to be disposed in the display device without reducing the density of subpixels in a display area.

One or more aspects of the present disclosure may provide a display device capable of sensing light in a specific wavelength band, for example, an infrared band.

One or more aspects of the present disclosure may provide a display device including a structure configured to enable an optical sensor to sense light using one or more touch sensor metals.

One or more aspects of the present disclosure may provide a display device including a structure configured to enable one or more optical sensors to sense light using one or more pixel anode electrodes.

One or more aspects of the present disclosure may provide a display device that has high efficiency and is capable of being driven at low power based on a structure configured to enable the display device to represent resolution uniformly across the entire display area.

According to one or more example embodiments of the present disclosure, a display device can be provided that includes a substrate, a pixel anode electrode disposed on the substrate, an emission layer configured to overlap with the pixel anode electrode, a pixel cathode electrode configured to overlap with the emission layer, an encapsulation layer configured to cover the pixel cathode electrode, a touch sensor disposed on the encapsulation layer, and an optical sensor including an optical sensor cathode electrode disposed over the substrate, an optical sensor intermediate layer configured to overlap with the pixel cathode electrode, and an optical sensor anode electrode that is electrically connected to the touch sensor or is identical to the pixel anode electrode.

According to one or more aspects of the present disclosure, a display device may be provided that is configured to allow an optical sensor to be disposed in the display device without reducing the density of subpixels in a display area.

According to one or more aspects of the present disclosure, a display device may be provided that is capable of sensing light in a specific wavelength band, for example, an infrared band.

According to one or more aspects of the present disclosure, a display device may be provided that includes a structure configured to enable an optical sensor to sense light using one or more touch sensor metals.

According to one or more aspects of the present disclosure, a display device may be provided that includes a structure configured to enable one or more optical sensors to sense light using one or more pixel anode electrodes.

According to one or more aspects of the present disclosure, a display device may be provided that has high efficiency and is capable of being driven at low power based on a structure configured to enable the display device to represent resolution uniformly across the entire display area.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
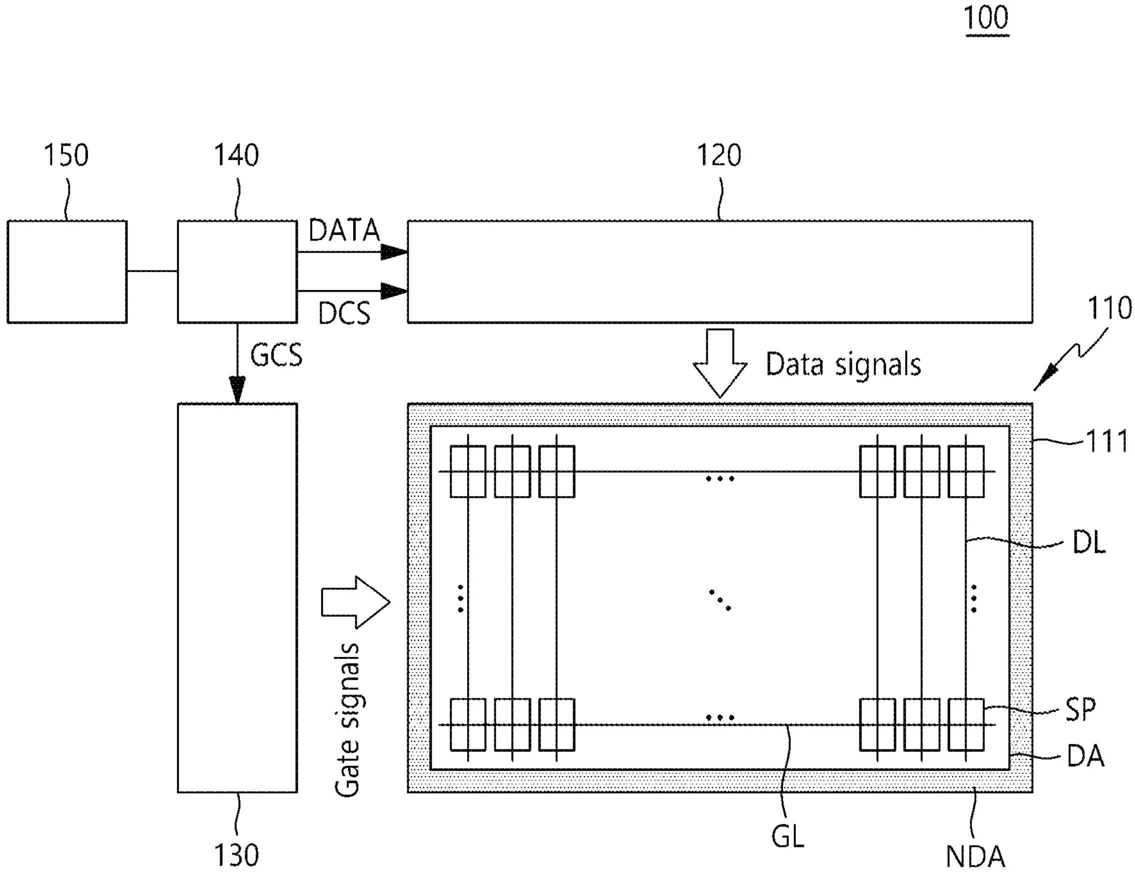
FIG. 1 illustrates an example system configuration of a display device according to aspects of the present disclosure.

Reference will now be made in detail to example embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified.

Like reference numerals designate like elements throughout, unless otherwise specified. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure.

In the following description, where the detailed description of the relevant known function or configuration may unnecessarily obscure aspects of the present disclosure, a detailed description of such known function or configuration may be omitted.

The shapes, sizes, ratios, dimensions (e.g., length, width, height, thickness, radius, diameter, area, etc.), angles, numbers, number of elements, and the like, which are illustrated in the drawings to describe various example embodiments of the present disclosure, are merely given by way of example. Therefore, the present disclosure is not limited to the illustrations in the drawings.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to", "contacts or overlaps", etc., a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc., each other via a fourth element. Here, the second element may be included in at least one of two or more elements that "are connected or coupled to", "contact or overlap", etc., each other.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In addition, when any dimensions, relative sizes, etc., are mentioned, it should be considered that numerical values for an elements or features, or corresponding information (e.g., level, range, etc.) include a tolerance or error range (e.g., 5% to 10%) that may be caused by various factors (e.g., process factors, internal or external impact, noise, etc.) even when a relevant description is not specified. Further, the term "may" fully encompasses all the meanings of the term "can".

Hereinafter, with reference to the accompanying drawings, various example embodiments of the present disclosure will be described in detail.

FIG. 1 illustrates an example configuration of a display device 100 according to aspects of the present disclosure.

FIG. 1 illustrates an example system configuration of the display device 100 according to aspects of the present disclosure.

Referring to FIG. 1, in one or more example embodiments, the display device 100 may include a display panel 110 and a display driving circuit as components for displaying an image. The display driving circuit may be a circuit for driving the display panel 110, and include a data driving circuit 120, a gate driving circuit 130, a display controller 140, and other circuit components.

The display panel 110 may include a substrate 111 and a plurality of subpixels SP disposed on the substrate 111.

The substrate 111 of the display panel 110 may include a display area DA allowing an image to be displayed and a non-display area NDA located outside of the display area DA.

A plurality of subpixels SP for displaying an image may be disposed in the display area DA, and the non-display area NDA may include a pad area PA located in a first direction from the display area DA.

In the display panel 110 according to aspects of the present disclosure, the non-display area NDA may have a very small area compared with the display area DA. Herein, the non-display area NDA may be also referred to as a "bezel" or a "bezel area."

For example, the non-display area NDA may include a first non-display area located outside of the display area DA in a first direction, a second non-display area located outside of the display area DA in a second direction intersecting the first direction, a third non-display area located outside of the display area DA in a direction opposite to the first direction, and a fourth non-display area located outside of the display area DA in a direction opposite to the second direction. One or two non-display areas among the first to fourth non-display areas may include a pad area to which the data driving circuit 120 is connected or bonded. In one or more aspects, among the first to fourth non-display areas, each of the remaining two or three non-display areas, which do not include the pad area, may have a very small size compared with the one or two non-display areas.

In one or more aspects, a boundary area between the display area DA and the non-display area NDA may be bent, and thereby, the non-display area NDA may be located under the display area DA. In this implementation, when the display device 100 is viewed in front thereof, all or most of the non-display area NDA may not be visible to the user.

Various types of signal lines for driving a plurality of subpixels SP may be disposed on the substrate 111 of the display panel 110.

In one or more aspects, the display device 100 may be a liquid crystal display device, or the like, or a self-emission display device in which light is emitted from the display panel 110 itself. In an example where the display device 100 according to aspects of the present disclosure is the self-emission display device, each of the plurality of subpixels SP may include a light emitting element.

For example, the display device 100 according to aspects of the present disclosure may be an organic light emitting display device implemented with organic light emitting diodes (OLED) as light emitting elements. In another example, the display device 100 according to aspects of the present disclosure may be an inorganic light emitting display device implemented with inorganic material-based light emitting diodes as light emitting elements. In further another example, the display device 100 according to aspects of the present disclosure may be a quantum dot display device implemented with quantum dots, which are self-emission semiconductor crystals, as light emitting elements.

The structure of each of the plurality of subpixels SP may depend on types of display device 100. For example, when the display device 100 is a self-emission display device including self-emission subpixels SP, each subpixel SP may include a self-emission light emitting element, one or more transistors, and one or more capacitors.

The various types of signal lines may include, for example, a plurality of data lines DL for carrying data signals (which may be referred to as data voltages or image signals), a plurality of gate lines GL for carrying gate signals (which may be referred to as scan signals), and the like.

In one or more aspects, the plurality of data lines DL and the plurality of gate lines GL may intersect one another. Each of the plurality of data lines DL may be configured to extend in a first direction, and each of the plurality of gate lines GL may be configured to extend in a second direction. For example, the first direction may be the column or vertical direction, and the second direction may be the row or horizontal direction. In another example, the first direction may be the row or horizontal direction, and the second direction may be the column or vertical direction. Hereinafter, for convenience of explanation, discussions may be provided based on examples where each of a plurality of data lines DL is disposed in the column direction, and each of a plurality of gate lines GL is disposed in the row direction, but example embodiments of the present disclosure are limited thereto.

The data driving circuit 120 may be a circuit for driving a plurality of data lines DL and can output data signals to the plurality of data lines DL.

The data driving circuit 120 can receive image data DATA in digital form from the display controller 140, convert the received image data DATA into data signals in analog form, and output converted data signals to the plurality of data lines DL.

In one or more aspects, the data driving circuit 120 may be connected to the display panel 110 by a tape-automated-bonding (TAB) technique, or connected to a conductive pad such as a bonding pad of the display panel 110 by a chip-on-glass (COG) technique or a chip-on-panel (COP) technique, or connected to the display panel 110 by a chip-on-film (COF) technique.

The data driving circuit 120 may be located in, and/or electrically connected to, but not limited to, only one side or portion (e.g., an upper edge or a lower edge) of the display panel 110. In one or more aspects, the data driving circuit 120 may be disposed in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or other design requirements.

The data driving circuit 120 may be connected to outside, or an edge, of the display area DA of the display panel 110, or be disposed in the display area DA of the display panel 110.

The gate driving circuit 130 may be a circuit for driving a plurality of gate lines GL and can output gate signals to the plurality of gate lines GL.

The gate driving circuit 130 can receive various types of gate driving control signals GCS, and further, receive a first gate voltage corresponding to a turn-on level voltage and a second gate voltage corresponding to a turn-off level voltage. Thereby, the gate driving circuit 130 can generate gate signals and supply the generated gate signals to the plurality of gate lines GL.

In one or more aspects, the gate driving circuit 130 included in the display device 100 may be embedded into the display panel 110 by a gate-in-panel (GIP) technique. In an example where the gate driving circuit 130 is implemented by the gate-in-panel (GIP) technique, the gate driving circuit 130 may be disposed on the substrate 111 of the display panel 110 during the manufacturing process of the display panel 110 or display device 100.

In one aspect, the gate driving circuit 130 included in the display device 100 may be disposed in the display area DA of the display panel 110. In this implementation, for example, the gate driving circuit 130 may be disposed in, and/or electrically connected to, but not limited to, a first area (e.g., a left area or a right area of the display area DA) of the display area DA of the display panel 110. In another example, the gate driving circuit 130 may be disposed in, and/or electrically connected to, but not limited to, a first area (e.g., a left area or a right area of the display area DA) and a second area (e.g., the right area or the left area of the display area DA) of the display area DA of the display panel 110.

Herein, the gate driving circuit 130 embedded in the display panel 110 using the gate-in-panel (GIP) technique may also be referred to as a "gate-in-panel circuit."

The display controller 140 may be a device for controlling the data driving circuit 120 and the gate driving circuit 130, and can control driving timing for the plurality of data lines DL and driving timing for the plurality of gate lines GL.

The display controller 140 can supply a data driving control signal DCS to the data driving circuit 120 to control the data driving circuit 120, and supply a gate driving control signal GCS to the gate driving circuit 130 to control the gate driving circuit 130.

The display controller 140 can receive image data input from a host system 150 and supply image data DATA readable by the data driving circuit 120 based on the input image data to the data driving circuit 120.

The display controller 140 may be implemented in a separate component from the data driving circuit 120, or incorporated in the data driving circuit 120 and thus implemented in an integrated circuit.

The display controller 140 may be a timing controller used in the typical display technology or a controller or a control device capable of performing other control functions in addition to the function of the typical timing controller. In one or more embodiments, the display controller 140 may be a controller or a control device different from the timing controller, or a circuitry or a component included in the controller or the control device. The display controller 140 may be implemented using various circuits or electronic components such as an integrated circuit (IC), a field programmable gate array (FPGA), an application specific integrated circuit (ASIC), a processor, and/or the like.

The display controller 140 may be mounted on a printed circuit board, a flexible printed circuit, and/or the like and be electrically connected to the gate driving circuit 120 and the data driving circuit 130 through the printed circuit board, flexible printed circuit, and/or the like.

The display controller 140 can transmit signals to, and receive signals from, the data driving circuit 120 via one or more selected interfaces. For example, such interfaces may include a low voltage differential signaling (LVDS) interface, an embedded clock point-point interface (EPI), a serial peripheral interface (SPI), and the like. However, example embodiments of the present disclosure are not limited thereto.

In one or more aspects, to provide a touch sensing function, as well as an image display function, the display device 100 may include a touch sensor, and a touch sensing circuit configured to sense the touch sensor and detect whether a touch is applied by an object such as a finger, a pen, or the like, or a location of the touch.

The touch sensing circuit may include a touch driving circuit configured to drive and sense the touch sensor and generate and output touch sensing data, and a touch controller capable of detecting whether a touch is applied or a location of the touch using the touch sensing data.

The touch sensor may include a plurality of touch electrodes. The touch sensor may further include a plurality of touch lines to electrically connect the plurality of touch electrodes to the touch driving circuit.

The touch sensor may be implemented in the form of a touch panel outside of the display panel 110 or be integrated inside of the display panel 110. In the example where the touch sensor is implemented in the form of the touch panel outside of the display panel 110, such a touch sensor may be referred to as an add-on type. In the example where the add-on type of touch sensor is disposed in the display device 100, the touch panel and the display panel 110 may be separately manufactured and combined in an assembly process. The add-on type of touch panel may include a touch panel substrate and a plurality of touch electrodes disposed on the touch panel substrate.

In the example where the touch sensor is disposed inside of the display panel 110, the touch sensor may be formed on the substrate along with signal lines and electrodes related to display driving during the manufacturing process of the display panel 110.

The touch driving circuit can supply a touch driving signal to at least one of a plurality of touch electrodes and generate touch sensing data by sensing at least one of the plurality of touch electrodes.

The touch sensing circuit can perform touch sensing by a self-capacitance sensing technique or a mutual-capacitance sensing technique.

In the example where the touch sensing circuit performs touch sensing by the self-capacitance sensing technique, the touch sensing circuit can perform touch sensing based on capacitance between each touch electrode and a touch object (e.g., a finger, a pen, and the like). According to the self-capacitance sensing technique, each of a plurality of touch electrodes can serve as both a driving touch electrode and a sensing touch electrode. The touch driving circuit may drive all, or one or more, of a plurality of touch electrodes and sense all, or one or more, of the plurality of touch electrodes.

In the example where the touch sensing circuit performs touch sensing by the mutual-capacitance sensing technique, the touch sensing circuit can perform touch sensing based on a capacitance between touch electrodes. According to the mutual-capacitance sensing technique, a plurality of touch electrodes may be divided into driving touch electrodes and sensing touch electrodes. The touch driving circuit can drive the driving touch electrodes and sense the sensing touch electrodes.

In one or more aspects, the touch driving circuit and touch controller included in the touch sensing circuit may be implemented in separate devices or in a single device. In one or more aspects, the touch driving circuit and the data driving circuit may be implemented in separate devices or in a single device.

The display device 100 may further include a power supply circuit for supplying various types of power to the display driving circuit and/or the touch sensing circuit.

In one or more aspects, the display device 100 may represent, but not limited to, a mobile terminal, such as a smart phone, a tablet, or the like, a monitor, a television (TV), or the like. Example embodiments of the present disclosure are not limited thereto. In one or more aspects, the display device 100 may be display devices, or include displays, of various types, sizes, and shapes for displaying information or images.

In one or more example embodiments, the display device 100 may further include an electronic device such as a camera (e.g., an image sensor), a sensor capable of detecting an object or light, and the like. For example, the sensor may be a sensor capable of detecting an object or a human body by receiving light such as infrared light, ultrasonic light, ultraviolet light or the like.

Figure 2:
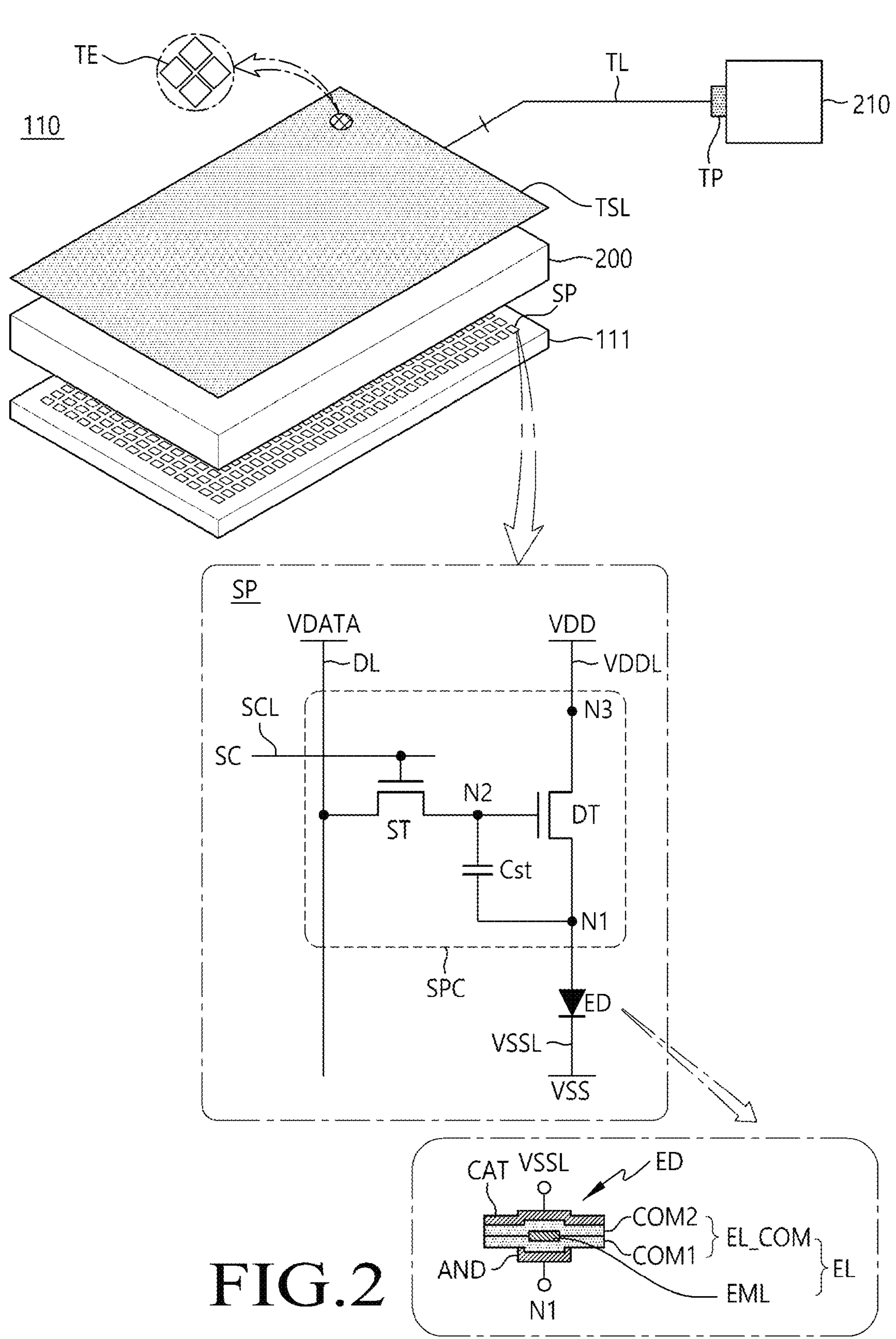
FIG. 2 illustrates an example display panel according to aspects of the present disclosure.

FIG. 2 illustrates an example display panel according to aspects of the present disclosure;

Referring to FIG. 2, in one or more example embodiments, the display panel 110 may include a substrate 111 on which a plurality of subpixels SP are disposed, and an encapsulation layer 200 over the substrate 111. The encapsulation layer 200 may also be referred to as an encapsulation substrate or an encapsulation stack.

Referring to FIG. 2, in an example where the display device 100 is a self-emission display device, each of the plurality of subpixels SP disposed on the substrate 111 may include a light emitting element ED and a subpixel circuit SPC for driving the light emitting element ED.

Referring to FIG. 2, the subpixel circuit SPC may include a plurality of pixel driving transistors and at least one capacitor for driving the light emitting element ED. The subpixel circuit SPC can drive the light emitting element ED by supplying a driving current to the light emitting element ED at a selected timing. The light emitting element ED can emit light by being driven by the driving current.

The plurality of pixel driving transistors may include a driving transistor DT for driving the light emitting element ED and a scan transistor ST configured to be turned on or off by a scan signal SC.

The driving transistor DT can supply a driving current to the light emitting element ED.

The scan transistor ST may be configured to control an electrical state of a corresponding node in the subpixel circuit SPC or to control the state or operation of the driving transistor DT.

The at least one capacitor may include a storage capacitor Cst configured to maintain a constant voltage during a display frame or a certain period of the display frame.

To drive one or more subpixels SP, at least one data signal VDATA, which is an image signal, and at least one scan signal SC, which is a gate signal, may be applied to one or more subpixels SP. Further, at least one common pixel driving voltage including a first common driving voltage VDD and a second common driving voltage VSS may be applied to the one or more subpixels SP.

The light emitting element ED may include an anode AE, a light emitting element intermediate layer EL, and a cathode CE. The light emitting element intermediate layer EL may be disposed between the anode AE and the cathode CE.

In an example where the light emitting element ED is an organic light emitting diode, the light emitting element intermediate layer EL may include an emission layer EL, a first common intermediate layer COM1 between the anode AE and the emission layer EL, and a second common intermediate layer COM2 between the emission layer EL and the cathode CE. The emission layer EL may be disposed in each subpixel SP. The first common intermediate layer COM1 and the second common intermediate layer COM2 may be commonly disposed across all or some of a plurality of subpixels SP The emission layer EL may be disposed in each subpixel SP, and the first common intermediate layer COM1 and the second common intermediate layer COM2 may be commonly disposed across all or some of a plurality of light emitting areas and a non-light emitting area. A layer including the first common intermediate layer COM1 and the second common intermediate layer COM2 may be referred to as a common intermediate layer EL_COM.

For example, the first common intermediate layer COM1 may include a hole injection layer (HIL), a hole transfer layer (HTL), and the like. The second common intermediate layer COM2 may include an electron transport layer (ETL), an electron injection layer (EIL), and the like. The hole injection layer can inject holes from the anode AE to the hole transport layer, the hole transport layer can transport holes to the emission layer EL, the electron injection layer can inject electrons from the cathode CE to the electron transport layer, and the electron transport layer can transport electrons to the emission layer EL.

For example, the cathode CE may be electrically connected to a second common driving voltage line VSSL. A second common driving voltage VSS, which is a type of common pixel driving voltage, may be applied to the cathode CE through the second common driving voltage line VSSL. The anode AE may be electrically connected to a first node N1 of a corresponding driving transistor DT of each subpixel SP. Herein, the second common driving voltage VSS may also be referred to as a "base voltage", and the second common driving voltage line VSSL may also be referred to as a "base voltage line.

For example, the anode AE may be a pixel electrode disposed in each subpixel SP, and the cathode CE may be a common electrode commonly disposed in all or some of a plurality of subpixels SP. In another example, the cathode CE may be a pixel electrode layer disposed in each subpixel SP, and the anode AE may be a common electrode commonly disposed in all or some of a plurality of subpixels SP. Herein, for convenience of explanation, discussions may be provided based on examples where the anode AE is a pixel electrode (may also be referred to as "a pixel anode electrode" or "a first pixel electrode"), and the cathode CE is a common electrode (may also be referred to as "a pixel cathode electrode" or "a second pixel electrode").

Each light emitting element ED may be configured by respective portions of a corresponding anode AE, a corresponding portion of the light emitting element intermediate layer EL, and a corresponding portion of the cathode CE that overlap with each other. A corresponding light emitting area may be formed by each light emitting element ED. For example, a corresponding light emitting area of each light emitting element ED may include an area in which a corresponding anode AE, a corresponding portion of the light emitting element intermediate layer EL, and a corresponding portion of the cathode CE overlap with each other.

In some aspects, the light emitting element ED may be an organic light emitting diode (OLED), an inorganic material-based light emitting diode (LED), a quantum dot light emitting element, or the like. For example, when the light emitting element ED is an organic light emitting diode OLED, the light emitting element intermediate layer EL of this light emitting element ED may be a light emitting element intermediate layer including an organic material.

The driving transistor DT may be a transistor configured to supply a driving current to the light emitting element ED. The driving transistor DT may be connected between a first common driving voltage line VDDL and the light emitting element ED.

The driving transistor DT may include a first node N1 electrically connected with the light emitting element ED, a second node N2 to which a data signal VDATA is applied, and a third node N3 to which a driving voltage VDD from a driving voltage line DVL (e.g., the first common driving voltage line VDDL) is applied.

In the driving transistor DT, the second node N2 may be a gate node, the first node N1 may be a source node or a drain node, and the third node N3 may be the drain node or the source node. Hereinafter, for merely convenience of explanation, discussions may be provided based on examples where the first, second, and third nodes (N1, N2, and N3) of the driving transistor DT are source, gate, and drain nodes, respectively. However, example embodiments of the present disclosure are not limited thereto.

The scan transistor ST included in the subpixel circuit SPC illustrated in FIG. 2 may be a switching transistor for allowing a data signal VDATA, which is an image signal, to be supplied to the second node N2, which is the gate node of the driving transistor DT.

The scan transistor ST can be turned on or turned off by a scan signal SC, which is a type of gate signal, applied through a scan line SCL, which is a type of gate line GL, and control an electrical connection between the second node N2 of the driving transistor DT and a data line DL. The drain electrode or source electrode of the scan transistor ST may be electrically connected to the data line DL. The source electrode or drain electrode of the scan transistor ST may be electrically connected to the second node N2 of the driving transistor DT. The gate electrode of the scan transistor ST may be electrically connected to the scan line SCL.

The storage capacitor Cst may be electrically connected between the first node N1 and the second node N2 of the driving transistor DT. The storage capacitor Cst may include a first capacitor electrode electrically connected to the first node N1 of the driving transistor DT or corresponding to the first node N1 of the driving transistor DT, and a second capacitor electrode electrically connected to the second node N2 of the driving transistor DT or corresponding to the second node N2 of the driving transistor DT.

In one or more aspects, the storage capacitor Cst, which may be present between the first node N1 and the second node N2 of the driving transistor DT, may be an external capacitor intentionally configured or designed to be located outside of the driving transistor DT, other than internal capacitors, such as parasitic capacitors (e.g., a gate-to-source capacitance Cgs, a gate-to-drain capacitance Cgd, and the like).

Each of the driving transistor DT and the scan transistor ST may be an n-type transistor or a p-type transistor.

The display panel 110 may have a top emission structure or a bottom emission structure.

In an example where the display panel 110 has the top emission structure, at least a portion of the subpixel circuit SPC may overlap with at least a portion of the light emitting element ED in the vertical direction. In an example where the display panel 110 has the bottom emission structure, the subpixel circuit SPC may not overlap the light emitting element ED in the vertical direction.

As shown in FIG. 2, the subpixel circuit SPC may include two transistors (2T: DT and ST) and one capacitor (1C: Cst) (which may be referred to as a "2T1C structure"), and in some implementations, may further include one or more transistors, or further include one or more capacitors.

For example, the subpixel circuit SPC may have an 8TIC structure including 8 transistors and 1 capacitor. In another example, the subpixel circuit SPC may have an 6T2C structure including 6 transistors and 2 capacitors. In further another example, the subpixel circuit SPC may have an 7T1C structure including 7 transistors and 1 capacitor.

The types and number of gate signals supplied to a subpixel SP, and/or the types and number of gate lines connected to the subpixel SP may vary depending on a structure of a corresponding subpixel circuit SPC.

Further, the types and number of common pixel driving voltages supplied to a subpixel SP may vary depending on a structure of a corresponding subpixel circuit SPC.

Since circuit elements (e.g., a light emitting element ED such as an organic light emitting diode (OLED) including an organic material) in each subpixel SP are vulnerable to external moisture or oxygen, an encapsulation layer 200 may be disposed in the display panel 110 in order to prevent the external moisture or oxygen from penetrating into the circuit elements (e.g., the light emitting element ED). The encapsulation layer 200 may be disposed in various shapes or configurations to prevent light emitting elements ED from contacting moisture or oxygen.

Referring to FIG. 2, in one or more example embodiments, to sense a touch of a user, the display device 100 may include a touch sensor layer TSL including a plurality of sensor electrodes, and a touch sensing circuit 210 configured to sense the plurality of sensor electrodes and determine whether a touch has been applied or a location of the touch (or touch coordinates) based on data obtained by sensing the sensor electrodes.

The touch sensor layer TSL may be embedded into the display panel 110. For example, the touch sensor layer TSL may be disposed on the encapsulation layer 200 of the display panel 110.

In addition to the touch sensor layer TSL, the display panel 110 may also include one or more touch pads to which the touch sensing circuit 210 is electrically connected, and a plurality of touch routing lines TL for electrically interconnecting the plurality of sensor electrodes included in the touch sensor layer TSL and the one or more touch pads connected to the touch sensing circuit 210.

Figure 3:
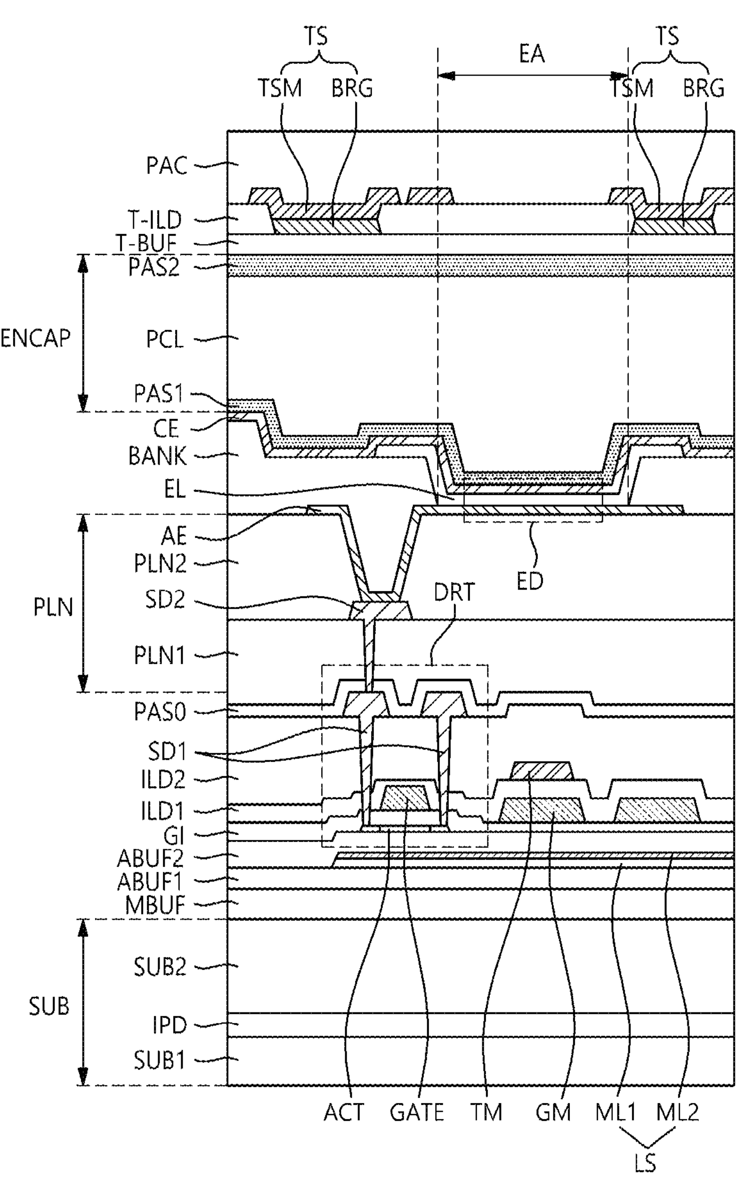
FIG. 3 is a cross-sectional view of an example display area in the display panel according to aspects of the present disclosure.

FIG. 3 is a cross-sectional view of an example display area in the display panel 110 according to aspects of the present disclosure.

Referring to FIG. 3, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture or oxygen into the display panel 110. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIG. 3, various types of patterns (ACT, SD1, GATE) for forming one or more transistors such as a driving transistor DRT, and the like, various types of insulating layers (MBUF, ABUF1, ABUF2, GI, ILD1, ILD2, PAS0), and various types of metal patterns (TM, GM, ML1, ML2) may be disposed on or over the substrate SUB.

Referring to FIG. 3, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of a driving transistor DRT (e.g., the driving transistor DT of FIG. 2 discussed above) may be disposed on the second active buffer layer ABUF2.

A gate insulating layer GI may be configured to cover the active layer ACT.

The gate electrode GATE of the driving transistor DRT may be disposed on the gate insulating layer GI. In one aspect, together with the gate electrode GATE of the driving transistor DRT, a gate material layer GM may be disposed on the gate insulating layer GI, at a location different from a location where the driving transistor DRT is disposed.

A first interlayer insulating layer ILD1 may be configured to cover the gate electrode GATE and the gate material layer GM. A metal pattern TM may be disposed on the first interlayer insulating layer ILD1. The metal pattern TM may be located at a location different from the location where the driving transistor DRT is disposed. A second interlayer insulating layer ILD2 may be configured to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other thereof may be a drain node of the driving transistor DRT. The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be configured to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the subpixel SP of FIG. 2) through a contact hole formed in the first planarization layer PLN1.

The second planarization layer PLN2 may be configured to cover the second source-drain electrode pattern SD2. A light emitting element ED of a subpixel SP may be disposed on the second planarization layer PLN2.

According to an example stack structure of the light emitting element ED, a pixel anode AE may be disposed on the second planarization layer PLN2. The pixel anode AE may be electrically connected to the second source-drain electrode pattern SD2 through a contact hole formed in the second planarization layer PLN2.

A bank BANK may be configured to cover a portion of the pixel anode AE. A portion of the bank BANK corresponding to the light emitting area EA of the subpixel SP may be opened.

A portion of the pixel anode AE may be exposed through the opening (the opened portion) of the bank BANK. At least a portion of an emission layer EL may be located on at least one side surface of the bank BANK and in the opening (the opened portion) of the bank BANK. All or at least part of the emission layer EL may be located between adjacent portions of the bank.

In the opening of the bank BANK, the emission layer EL may contact the pixel anode AE. A pixel cathode CE may be disposed on the emission layer EL.

The light emitting element ED can be formed by the pixel anode AE, the emission layer EL, and the pixel cathode CE. The emission layer EL may include an organic material layer.

An encapsulation layer ENCAP (e.g., the encapsulation layer 200 of FIG. 2 discussed above) may be disposed on the stack of the light emitting element ED.

The encapsulation layer ENCAP may have a single-layer stack or a multi-layer stack. For example, the encapsulation layer ENCAP may include a first inorganic encapsulation layer PAS1, an organic encapsulation layer PCL, and a second inorganic encapsulation layer PAS2.

For example, the first inorganic encapsulation layer PAS1 and the second inorganic encapsulation layer PAS2 may be inorganic layers, and the organic encapsulation layer PCL may be an organic layer. For example, among the first inorganic encapsulation layer PAS1, the organic encapsulation layer PCL, and the second inorganic encapsulation layer PAS2, the organic encapsulation layer PCL may have a greatest thickness, and can serve as a planarization layer.

The first inorganic encapsulation layer PAS1 may be disposed on the pixel cathode CE and may be disposed closest to the stack of the light emitting element ED. The first inorganic encapsulation layer PAS1 may include an inorganic insulating material, which may be deposited at a low temperature. For example, the first inorganic encapsulation layer PAS1 may include, but not limited to, silicon nitride (SiNx), silicon oxide (SiOx), silicon oxynitride (SiON), aluminum oxide (Al2O3), or the like. Since the first inorganic encapsulation layer PAS1 is deposited in a low temperature atmosphere, during the deposition process, the first inorganic encapsulation layer PAS1 can prevent the emission layer EL including an organic material vulnerable to a high temperature atmosphere from being damaged.

The organic encapsulation layer PCL may have an area or size smaller than the first inorganic encapsulation layer PAS1 in a plan view. For example, the organic encapsulation layer PCL may be configured to expose both ends or edges of the first inorganic encapsulation layer PAS1. The organic encapsulation layer PCL can serve as a buffer for relieving stress between corresponding layers while the display device 100 is curved or bent, and also serve to enhance planarization performance. For example, the organic encapsulation layer PCL may include an organic insulating material, such as acrylic resin, epoxy resin, polyimide, polyethylene, silicon oxycarbon (SiOC), or the like. The organic encapsulation layer PCL may be disposed, for example, using an inkjet technique.

The second inorganic encapsulation layer PAS2 may be disposed over the substrate SUB over which the organic encapsulation layer PCL is disposed, and configured to cover the respective top surfaces and side surfaces of the organic encapsulation layer PCL and the first inorganic encapsulation layer PAS1. The second inorganic encapsulation layer PAS2 can minimize or prevent external moisture or oxygen from penetrating into the first inorganic encapsulation layer PAS1 and the organic encapsulation layer PCL. For example, the second inorganic encapsulation layer PAS2 may include an inorganic insulating material, such as silicon nitride (SiNx), silicon oxide (SiOx), silicon oxynitride (SiON), aluminum oxide (Al2O3), or the like.

Referring to FIG. 3, in an example where one or more touch sensors TS are embedded into the display panel 110, the one or more touch sensors TS may be disposed on the encapsulation layer ENCAP. An example touch sensor structure will be described in detail as follows.

A touch buffer layer T-BUF may be disposed on the encapsulation layer ENCAP. Touch sensors TS may be disposed on the touch buffer layer T-BUF.

The touch sensors TS may include touch sensor metals TSM and bridge metals BRG, which are located in different layers.

A touch interlayer insulating layer T-ILD may be disposed between the touch sensor metals TSM and the bridge metals BRG.

For example, the touch sensor metals TSM may include a first touch sensor metal TSM, a second touch sensor metal TSM, and a third touch sensor metal TSM, which are disposed adjacent to one another. In an example where the third touch sensor metal TSM is disposed between the first touch sensor metal TSM and the second touch sensor metal TSM, and the first touch sensor metal TSM and the second touch sensor metal TSM are required to be electrically connected to each other, the first touch sensor metal TSM and the second touch sensor metal TSM may be electrically connected to each other through a bridge metal BRG located in a different layer. The bridge metal BRG may be electrically insulated from the third touch sensor metal TSM by the touch interlayer insulating layer T-ILD.

While the touch sensors TS are disposed in the display panel 110, a chemical solution (e.g., a developer or etchant) used in the corresponding process or moisture from outside of the display panel 110 may be generated or introduced. In one or more aspects, by disposing the touch sensors TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

To prevent damage to the emission layer EL including an organic material, which is vulnerable to high temperatures, the touch buffer layer T-BUF can be formed at a low temperature less than or equal to a selected temperature (e.g., 100 degrees (° C.)) and be formed using an organic insulating material with a low permittivity of 1 to 3. For example, the touch buffer layer T-BUF may include an acrylic-based, epoxy-based, or siloxan-based material. As the display device 100 is bent, the encapsulation layer ENCAP may be damaged, and the touch sensor metals TSM located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be configured to cover the touch sensors TS. The protective layer PAC may be, for example, an organic insulating layer.

In one or more aspects, the display device 100 can perform touch sensing by a self-capacitance sensing technique or a mutual-capacitance sensing technique. Hereinafter, for convenience of explanation, discussions may be provided based on examples where the display device 100 performs touch sensing based on the mutual-capacitance sensing technique, and has a structure configured to sense a touch based on the mutual-capacitance sensing technique, but example embodiments of the present disclosure are limited thereto.

Figure 4:
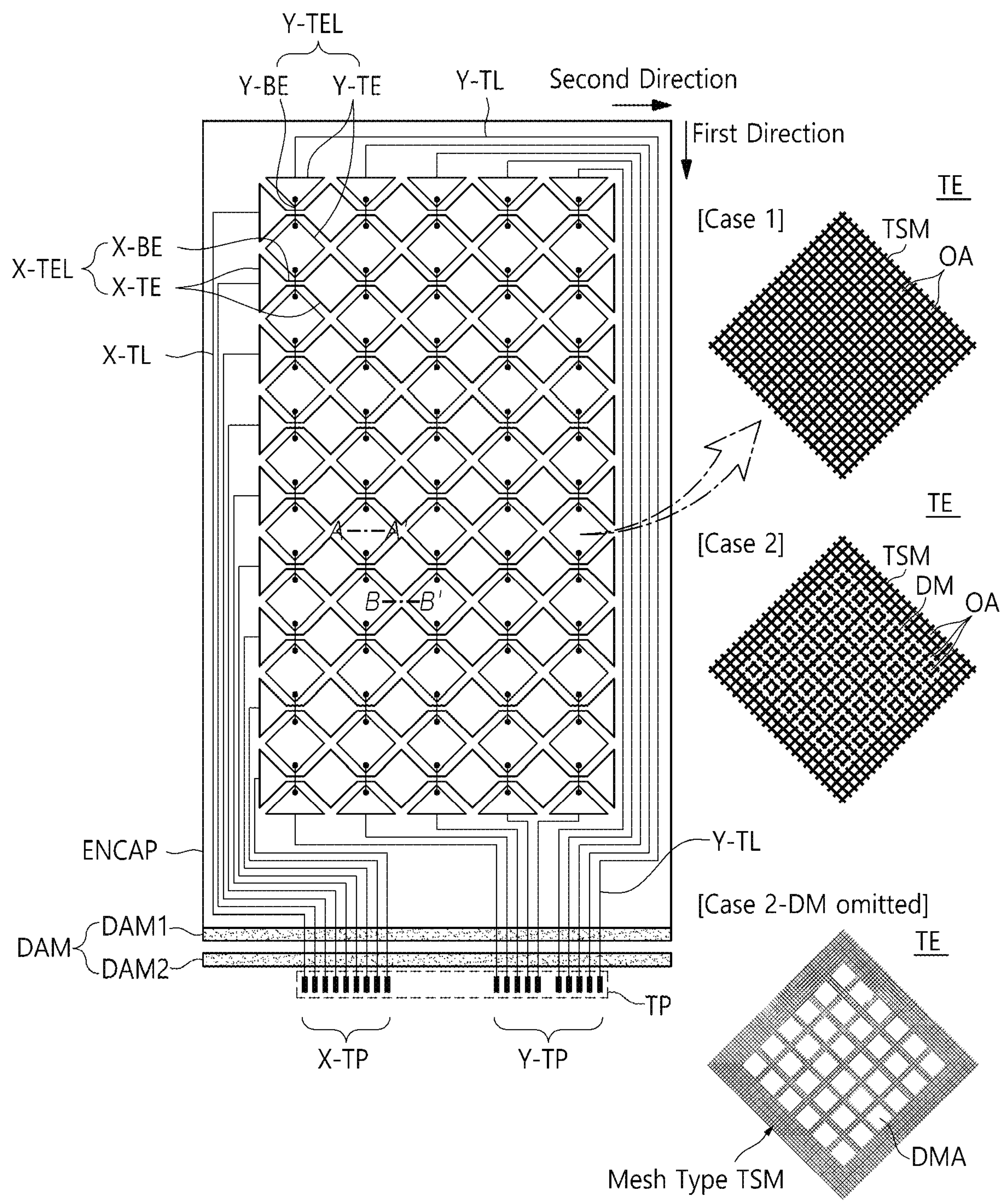
FIG. 4 is an example plan view of the display panel of the display device according to aspects of the present disclosure.

FIG. 4 is an example plan view of the display panel 110 of the display device 100 according to aspects of the present disclosure.

Referring to FIG. 4, in one or more example embodiments, in an example where the display device 100 is configured to perform mutual capacitance-based touch sensing, a touch sensor structure of the display device 100 may include a plurality of first touch electrode arrays X-TEL and a plurality of second touch electrode arrays Y-TEL. For example, the plurality of first touch electrode arrays X-TEL and the plurality of second touch electrode arrays Y-TEL may be located on the encapsulation layer ENCAP.

The plurality of first touch electrode arrays X-TEL and the plurality of second touch electrode arrays Y-TEL may intersect to each other. Each of the plurality of second touch electrode arrays Y-TEL may be arranged in a first direction (e.g., the column direction). Each of the plurality of first touch electrode arrays X-TEL may be arranged in a second direction (e.g., the row direction) different from the first direction.

The first direction and the second direction may be directions relative to each other. For example, the first direction may be a y-axis direction (e.g., the column direction), and the second direction may be an x-axis direction (e.g., the row direction). In another example, the first direction may be the x-axis direction (e.g., the row direction) and the second direction may be the y-axis direction (e.g., column direction). For example, the first direction and the second direction may or may not be orthogonal to each other.

For example, the terms "row" and "column" may be relative to each other, and therefore, be switched depending on a direction in which a user views the display panel 110 or the display device 100. For example, the first direction may be a direction parallel to a direction in which data lines DL run, and the second direction may be a direction parallel to a direction in which gate lines GL run.

In the example touch sensor structure of FIG. 4, each of the plurality of first touch electrode arrays X-TEL may include a plurality of first touch electrodes X-TE, which are electrically connected to each other, and each of the plurality of second touch electrode arrays Y-TEL may include a plurality of second touch electrodes Y-TE, which are electrically connected to each other.

The plurality of first touch electrode arrays X-TEL and the plurality of second touch electrode arrays Y-TEL may perform functions different from each other.

For example, the plurality of first touch electrode arrays X-TEL may be driving touch electrode arrays driven by a touch driving signal supplied by the touch driving circuit 160, and the plurality of second touch electrode arrays Y-TEL may be sensing touch electrode arrays sensed by the touch driving circuit 160.

In this example, a plurality of first touch electrodes X-TE included in each of the plurality of first touch electrode arrays X-TEL may be driving touch electrodes, and a plurality of second touch electrodes Y-TE included in each of the plurality of second touch electrode arrays Y-TEL may be sensing touch electrodes.

In another example, the plurality of first touch electrode arrays X-TEL may be sensing touch electrode arrays sensed by the touch driving circuit 160, and the plurality of second touch electrode arrays Y-TEL may be driving touch electrode arrays driven by a touch driving signal supplied by the touch driving circuit 160.

In this example, a plurality of first touch electrodes X-TE included in each of the plurality of first touch electrode arrays X-TEL may be sensing touch electrodes, and a plurality of second touch electrodes Y-TE included in each of the plurality of second touch electrode arrays Y-TEL may be driving touch electrodes.

In one or more aspects, touch sensors may include a plurality of touch routing lines (X-TL, Y-TL) in addition to the plurality of first touch electrode arrays X-TEL and the plurality of second touch electrode arrays Y-TEL.

The plurality of touch routing lines (X-TL, Y-TL) may include one or more first touch routing lines X-TL connected to each of the plurality of first touch electrode arrays X-TEL, and one or more second touch routing lines Y-TL connected to each of the plurality of second touch electrode arrays Y-TEL.

Referring to FIG. 4, each of the plurality of first touch electrode arrays X-TEL may include a plurality of first touch electrodes X-TE, which are disposed in the same row (or column) and electrically connected to each other, and a plurality of first touch bridge electrodes X-BE, which electrically interconnect first touch electrodes X-TE adjacent to each other in the second direction.

For example, as shown in FIG. 4, each first touch bridge electrodes X-BE interconnecting two adjacent first touch electrodes X-TE may be a metal integrally formed with the two adjacent first touch electrodes X-TE. In another example, each first touch bridge electrodes X-BE interconnecting two adjacent first touch electrodes X-TE may be located on a different layer from the two adjacent first touch electrodes X-TE, and be electrically connected to the two adjacent first touch electrodes X-TE through a contact hole.

Referring to FIG. 4, each of the plurality of second touch electrode arrays Y-TEL may include a plurality of second touch electrodes Y-TE, which are disposed in the same column (or row) and electrically connected to each other, and a plurality of second touch bridge electrodes Y-BE, which electrically interconnect second touch electrodes Y-TE adjacent to each other in the first direction.

For example, as shown in FIG. 4, each second touch bridge electrodes Y-BE interconnecting two adjacent second touch electrodes Y-TE may be located on a different layer from the two adjacent second touch electrodes Y-TE, and be electrically connected to the two adjacent second touch electrodes Y-TE through a contact hole. In another example, each second touch bridge electrodes Y-BE interconnecting two adjacent second touch electrodes Y-TE may be a metal integrally formed with the two adjacent second touch electrodes Y-TE.

In an area (a touch electrode line intersection area) where a first touch electrode array X-TEL and a second touch electrode array Y-TEL intersect, a corresponding first touch bridge electrode X-BE and a corresponding second touch bridge electrode Y-BE may intersect each other. In the touch electrode line intersection area, when the first touch bridge electrode X-BE and the second touch bridge electrode Y-BE intersect each other, the first touch bridge electrode X-BE and the second touch bridge electrode Y-BE may be located in layers different from each other.

In this implementation, to dispose a plurality of first touch electrode arrays X-TEL and a plurality of second touch electrode arrays Y-TEL to intersect each other, a plurality of first touch electrodes X-TE, a plurality of first touch bridge electrode X-BE, a plurality of second touch electrodes Y-TE, and a plurality of second touch bridge electrodes Y-BE may be located in two or more layers.

Referring to FIG. 4, each of the plurality of first touch electrode arrays X-TEL may be electrically connected to a corresponding first touch pad X-TP among pads disposed in a touch pad area TP through a corresponding first touch routing line X-TL. Each of the plurality of second touch electrode arrays Y-TEL may be electrically connected to a corresponding second touch pad Y-TP among the pads disposed in the touch pad area TP through a corresponding second touch routing line Y-TL.

Touch sensors may include a plurality of first touch electrodes X-TE included in each of a plurality of first touch electrode arrays X-TEL and a plurality of second touch electrodes Y-TE included in each of the plurality of second touch electrode arrays Y-TEL, further include a plurality of first touch bridge electrodes X-BE and a plurality of second touch bridge electrodes Y-BE, and further include a plurality of first touch routing lines X-TL and a plurality of second touch routing lines Y-TL.

Among the elements included in the touch sensors, some elements may include touch sensor metals TSM, and other elements or the other elements may include touch bridge metals. In one or more aspects, the touch sensor metals TSM and the touch bridge metals may be metals located in different layers.

For example, a plurality of first touch electrodes X-TE included in each of a plurality of first touch electrode arrays X-TEL and a plurality of second touch electrodes Y-TE included in each of the plurality of second touch electrode arrays Y-TEL may include touch sensor metals TSM.

Among the plurality of first touch bridge electrodes X-BE and the plurality of second touch bridge electrodes Y-BE, one part (e.g., the plurality of first touch bridge electrodes X-BE) may include touch sensor metals TSM, and the remaining part (e.g., the plurality of second touch bridge electrodes Y-BE) may include touch bridge metals located in a layer different from the touch sensor metals TSM.

For example, all of the plurality of first touch routing lines X-TL and the plurality of second touch routing lines Y-TL may include touch sensor metals TSM. In another example, all of the plurality of first touch routing lines X-TL and the plurality of second touch routing lines Y-TL may include touch bridge metals. In another example, among the plurality of first touch routing lines X-TL and the plurality of second touch routing lines Y-TL, one part may include touch sensor metals TSM and the other part may include touch bridge metals.

In one or more aspects, as shown in FIGS. 3 and 4, a plurality of first touch electrodes X-TE included in a plurality of first touch electrode arrays X-TEL and a plurality of first touch bridge electrodes X-BE may be disposed on the encapsulation layer ENCAP located on the common electrode CE. A plurality of second touch electrodes Y-TE included in a plurality of second touch electrode arrays Y-TEL and a plurality of second touch bridge electrodes Y-BE may be disposed on the encapsulation layer ENCAP.

In one or more aspects, as shown in FIG. 4, each of a plurality of first touch routing lines X-TL electrically connected to a plurality of first touch electrode arrays X-TEL may be disposed on the encapsulation layer ENCAP, and extend to an area where the encapsulation layer ENCAP is not disposed and then be electrically connected to a plurality of first touch pads X-TP. Each of a plurality of second touch routing lines Y-TL electrically connected to a plurality of second touch electrode arrays Y-TEL may be disposed on the encapsulation layer ENCAP, and extend to an area where the encapsulation layer ENCAP is not disposed and then be electrically connected to a plurality of second touch pads Y-TP. For example, the encapsulation layer ENCAP may be located in the display area DA. In another example, the encapsulation layer ENCAP may extend to a portion of the non-display area NDA.

In one or more aspects, in order to prevent one or more layers (e.g., the encapsulation layer ENCAP including an organic material described above for the configuration FIGS. 3 and 4) in the display area DA of the display panel 110 from collapsing, a dam area DAM may be disposed in a boundary area between the display area DA and the non-display area NDA outside of the display area DA or in a portion of non-display area NDA. For example, the dam area DAM may be located adjacent to, or in contact with, at least one outermost edge of the encapsulation layer ENCAP.

For example, the dam area DAM may include one or more dams (DAM1 and/or DAM2). For example, as shown in FIG. 4, the dam area DAM may include a first dam DAM1 and a second dam DAM2. The second dam DAM2 may be located farther away from the display area DA than the first dam DAM1. Unlike the example of FIG. 4, the dam area DAM may include any one of the first dam DAM1 and the second dam DAM2, or include one or more additional dams in addition to the first dam DAM1 and the second dam DAM2.

Referring to FIG. 4, for example, the encapsulation layer ENCAP may be located on an inner side surface than the dam area DAM, which faces the display area DA. In another example, the encapsulation layer ENCAP may be located on the inner side surface of the dam area DAM, and configured to extend to an upper portion and/or a lower portion of the dam area DAM. The encapsulation layer ENCAP may be configured to further extend to an outer side surface of the dam area DAM.

In one or more aspects, touch electrodes (X-TE, and/or Y-TE) included in the display panel 110 of the display device 100 may be, for example, plate-shaped touch sensor metals TSM without an opening. In this implementation, each touch electrode TE may be a transparent electrode. For example, each touch electrode TE may include a transparent electrode material, which may allow light emitted from subpixels SP disposed under touch electrodes TE to be transmitted upwardly.

In one or more aspects, as shown in case 1 of FIG. 4, touch electrodes TE disposed in the display panel 110 may be patterned in a mesh configuration. In this implementation, each touch electrode TE may be a touch sensor metal TSM patterned in the mesh configuration (which may be referred to as a mesh-patterned touch sensor metal TSM) and having a plurality of openings OA. A corresponding touch sensor metal TSM of each touch electrode TE may be used to sense a touch. For example, a touch driving signal may be applied to the touch sensor metal TSM, or a touch sensing signal may be detected through the touch sensor metal TSM. A corresponding touch sensor metal TSM of each touch electrode TE may be located on a bank disposed in an area other than light emitting areas EA of subpixels SP.

As shown in Case 2 of FIG. 4, when each touch electrode TE is a touch sensor metal TSM patterned in the mesh configuration, a plurality of openings OA may be present in an area where the touch electrode TE is disposed. Each of the plurality of openings OA present in each touch electrode TE may correspond to a light emitting area EA of each subpixel SP or may correspond to a transmissive area TA. For example, the plurality of openings OA may cause light emitting areas EA to be formed by providing paths for enabling light emitted from subpixels SP disposed under the openings OA to travel upwardly, or may cause transmissive areas EA to be formed by providing paths for enabling the light to travel.

Touch electrodes TE may have a four-sided shape such as a diamond shape, square, rectangle, rhombus, or the like, or may have various shapes such as a triangle, pentagon, hexagon, or the like. A plurality of openings OA may have various shapes depending on the shape of each touch electrode TE or the shapes of meshes (i.e., spaces) formed by sub-metals of each mesh-patterned touch sensor metal TSM.

As in case 2 of FIG. 4, one or more dummy metals DM may be disposed disconnected with a mesh-patterned touch sensor metal TSM in a corresponding area of each touch electrode TE. The one or more dummy metals DM may be configured to be surrounded by the touch sensor metal TSM disposed in the area of the touch electrode TE. Unlike the touch sensor metal TSM, the dummy metal DM may be a floating metal such that a touch driving signal is not applied to the dummy metal DM, and a touch sensing signal is not detected through the dummy metal DM. The touch sensor metal TSM may be electrically connected to the touch driving circuit 160, but the dummy metal DM may not be electrically connected to the touch driving circuit 160.

In one or more aspects, in a respective area of each touch electrode TE, one or more dummy metals DM may be configured to be disconnected with a corresponding touch sensor metal TSM. In one or more aspects, while one or more dummy metals DM may be configured to be disconnected with a corresponding touch sensor metal TSM in corresponding one or more areas of one or more touch electrodes TE among a plurality of touch electrodes TE, a dummy metal DM may not be disposed in corresponding one or more areas of one or more other touch electrodes TE.

It should be noted here that when only a mesh-patterned touch sensor metal TSM is disposed without one or more dummy metals DM in the area of a corresponding touch electrode TE, there may occur an issue (which may referred to as an outline recognizing issue) where the outline of the touch sensor metal TSM can be recognized on the screen of display device 100. In contrast, as shown in FIG. 4, when one or more dummy metals DM are disposed in the area of the touch electrode TE, such an outline recognizing issue, in which the outline of the touch sensor metal TSM is recognized on the screen of display device 100, can be prevented.

In one or more aspects, whether to dispose a dummy metal or number (e.g., a dummy metal ratio) of dummy metals DM can be adjusted on a touch electrode basis, and therefore, touch sensitivity can be improved by adjusting a corresponding capacitance across each touch electrode TE.

In one or more aspects, one or more dummy metals DM may be formed by cutting (or etching) one or more points (or portions) in a touch sensor metal TSM disposed in the area of one touch electrode TE. Thus, the touch sensor metal TSM and the one or more dummy metals DM may be the same material formed in the same layer.

As in Case 2 of FIG. 4, it should be understand that the illustration where in the area of one touch electrode TE, one or more dummy metals DM are omitted, and only a touch sensor metal TSM is illustrated may include one or more dummy metals DM disposed in the area where the touch sensor metal TSM is disposed although not show in corresponding figures. A plurality of dummy areas DMA may be areas corresponding to a plurality of dummy metals DM.

In one or more example embodiments, one or more optical sensors for sensing light may be disposed in a portion of the display area DA of the display panel 110.

According to these embodiments, the display panel 110 or the display device 100 can provide an advantage of capable of maintaining the luminance and resolution of an area where an optical sensor is disposed even when the optical sensor is disposed without reducing the number of subpixels SP included in the display area DA.

Hereinafter, various example structures of the display panel 110 configured to allow an optical sensor to be disposed in the display area DA will be described with reference to FIGS. 5 to 22.

FIGS. 5, 6, 7, 8, and 9 are example plan views of the display device 100 including optical sensors according to aspects of the present disclosure.

Figure 5:
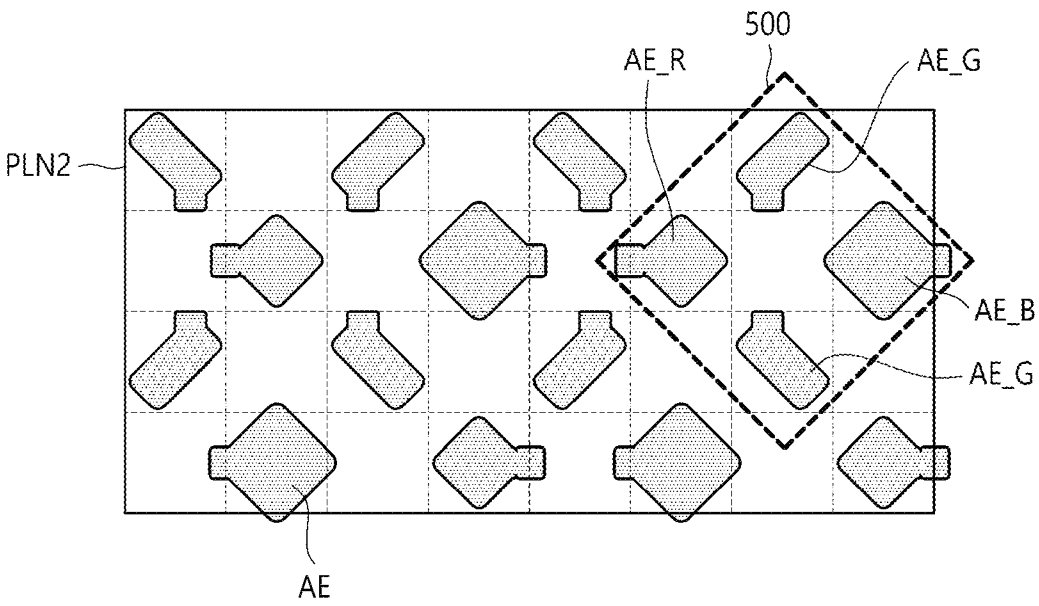
FIGS. 5, 6, 7, 8, and 9 are example plan views of the display device including optical sensors according to aspects of the present disclosure.

Referring to FIG. 5, pixel anode electrodes AE may be disposed on a second planarization layer (e.g., the second planarization layer PLN2 of FIG. 3 discussed above).

The pixel anode electrodes AE may be disposed in areas corresponding to light emitting areas EA.

A size of each pixel anode electrode AE may depend on a type of an emission layer EL disposed on each pixel anode electrode AE.

For example, a pixel anode electrode AE_B on which an emission layer EL_B emitting blue light is disposed may be a rhombus-shaped pixel anode electrode AE_B with the largest area among selected types of pixel anode electrodes AE. A pixel anode electrode AE_R on which an emission layer EL_R emitting red light is disposed may be a rhombus-shaped pixel anode electrode AE_R with an area smaller than the pixel anode electrode AE_B on which the emission layer EL_B emitting blue light is disposed. A pixel anode electrode AE_G on which an emission layer EL_G emitting green light is disposed may be a rectangular-shaped pixel anode electrode AE_G whose height is greater than a width.

For example, one pixel anode AE_B on which an emission layer EL_B emitting blue light is disposed may be disposed in a pixel area 500 forming one pixel. One pixel anode electrode AE_R on which an emission layer EL_R emitting red light is disposed may be disposed in the pixel area 500. Two pixel anode electrodes AE_G on which emission layers EL_G emitting green light are disposed respectively may be disposed in the pixel area 500.

It should be noted that this implementation is merely one example for discussing an example embodiment of the present disclosure, and therefore, the configuration of pixel areas 500 may vary depending on design requirements for the display device 100.

Figure 6:
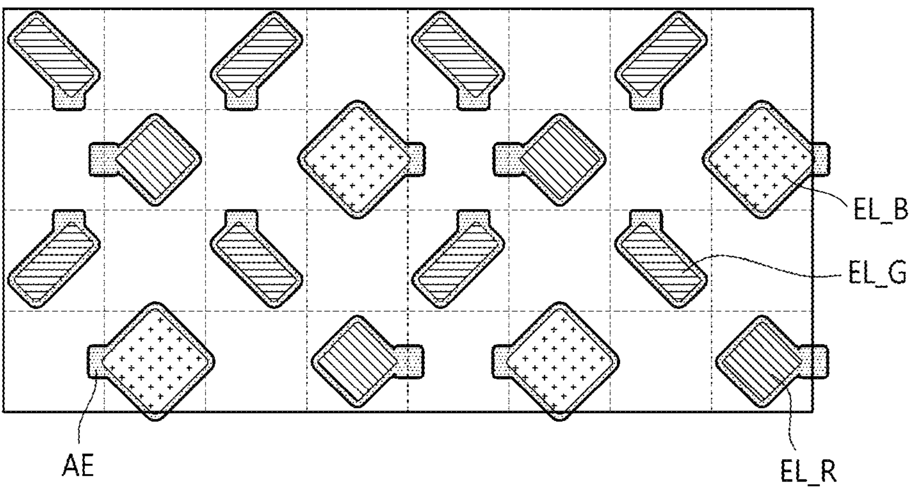

Although not shown in FIG. 6, a bank BANK may be configured to cover portions of pixel anode electrodes AE. Portions of the bank BANK corresponding to light emitting areas EA of subpixels SP may be opened.

Referring to FIG. 6, emission layers EL may be disposed on pixel anode electrodes AE exposed through the openings of the bank BANK. The emission layers EL may include one or more red emission layers 601 emitting red light, one or more green emission layers 602 emitting green light, and one or more blue emission layers 603 emitting blue light. Each emission layer EL may include an organic material.

It should be noted that the foregoing description on the colors of the emission layers EL is only one example for explaining one or more example embodiments of the present disclosure. That is, colors of emission layers EL may vary depending on design requirements for the display device 100. For example, emission layers EL may further include one or more white emission layers EL_W emitting white light.

The red emission layers EL_R, the green emission layers EL_G, and the blue emission layers EL_B may contact the pixel anode electrodes AE at respective openings of the bank BANK.

Although not shown in FIG. 6, a pixel cathode electrode CE may be disposed on the red emission layers EL_R, the green emission layers EL_G, and the blue emission layers EL_B.

A light emitting element ED may be formed by a corresponding one of the pixel anode electrodes AE, a corresponding one of the emission layers EL, and a corresponding portion of the pixel cathode electrode CE.

Although not shown in FIG. 6, an encapsulation layer (200, ENCAP) may be disposed on the light emitting elements ED. The encapsulation layer (200, ENCAP) may have a single-layer structure or a multi-layer structure. The encapsulation layer (200, ENCAP) may have the same structure as the encapsulation layer (200, ENCAP) illustrated in FIG. 3.

Figure 7:
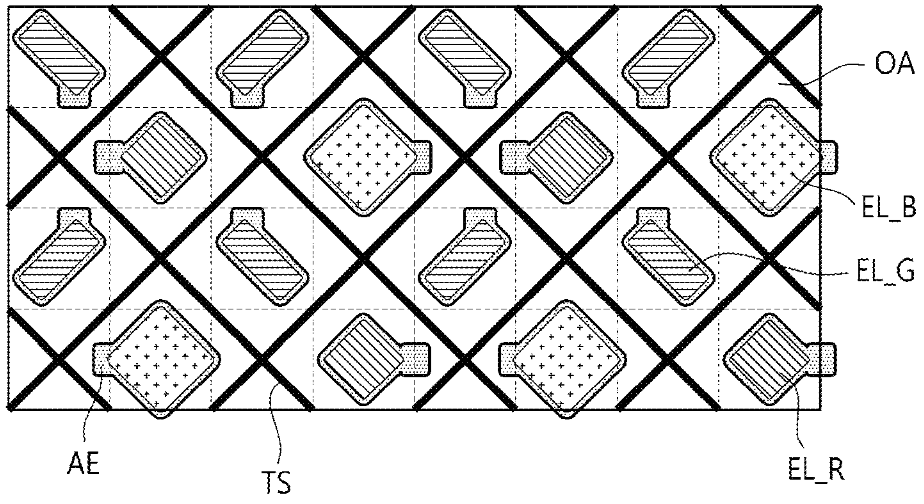

FIG. 7 illustrates an example structure in which a touch sensor TS is disposed in the display panel 110 according to aspects of the present disclosure.

As described above with reference to FIG. 3, in one or more aspects, the display device 100 can sense a touch by the mutual-capacitance sensing technique or by the self-capacitance sensing technique. Hereinafter, for convenience of explanation, discussions are provided based on examples where the display device 100 performs touch sensing based on the mutual-capacitance sensing technique, and has a touch sensor structure configured to sense a touch based on the mutual-capacitance sensing technique, but example embodiments of the present disclosure are limited thereto.

In an example where touch sensors TS are embedded into the display panel 110, the touch sensors TS may be disposed on an encapsulation layer (e.g., the encapsulation layer (200, ENCAP) of FIGS. 2 and 3 described above). The touch sensor TS of FIG. 7 may be the same structure as the touch sensors TS of FIGS. 2 and 3 described above.

A touch buffer layer T-BUF may be disposed on the encapsulation layer (200, ENCAP). A touch sensor TS may be disposed on the touch buffer layer T-BUF. A touch interlayer insulating layer T-ILD may be disposed between a touch sensor metal TSM and a bridge metal BRG, which are included in the touch sensor TS.

The touch sensor metal TSM included in the touch sensor TS may be patterned in the mesh configuration, and a plurality of openings may be disposed in meshes (i.e., spaces) formed by sub-metals of the mesh-patterned touch sensor metal. The meshes (i.e., spaces) of the mesh-patterned touch sensor metal TSM may have a four-sided shape such as a diamond shape, square, rectangle, rhombus, or the like, or may have various shapes such as a triangle, pentagon, hexagon, or the like.

Referring to FIG. 7, touch sensor metal TSM patterned in the mesh configuration (i.e., mesh-patterned touch sensor metal TSM) may include touch sensor sub-metals TSM disposed in a first diagonal direction and touch sensor sub-metals TSM disposed in a second diagonal direction.

The touch sensor sub-metal TSM disposed in the first diagonal direction and the touch sensor sub-metal TSM disposed in the second diagonal direction may intersect each other.

The first diagonal direction and the second diagonal direction may be directions relative to each other. For example, the first diagonal direction may be a direction from an upper left edge to a lower right edge. The second diagonal direction may be a direction from an upper right edge to a lower left edge. The first diagonal direction and the second diagonal direction may or may not be orthogonal to each other.

Herein, the terms "upper," "lower," "left," and "right" may be relative to each other, and therefore, be switched depending on a direction in which a user views the display panel 110 or the display device 100.

Referring to FIG. 7, light emitting elements ED may be disposed in a plurality of openings corresponding to meshes (i.e., spaces) formed by sub-metals included in the touch sensor metal TSM pattern in the mesh configuration.

A protective layer PAC may be configured to cover the touch sensor TS. The protective layer PAC may be, for example, an organic insulating layer.

The protective layer PAC may include contact holes in areas that overlap with intersections of touch sensor sub-metals TSM.

It should be noted that the touch buffer layer T-BUF, the touch interlayer insulating layer T-ILD, and the protective layer PAC are not shown in FIG. 7 for simplicity.

Figure 8:
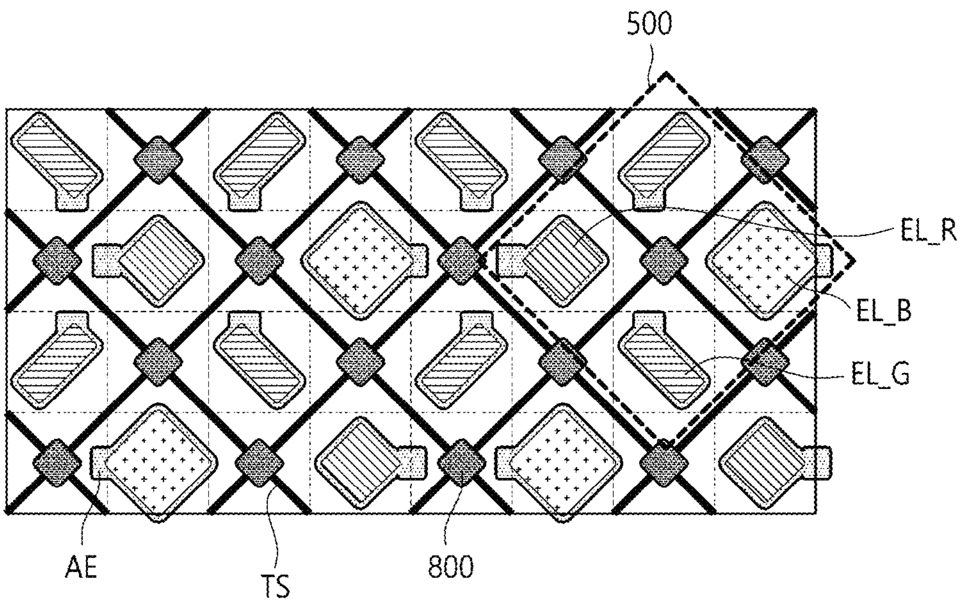

FIG. 8 illustrates an example structure in which optical sensor intermediate layers are disposed in the display panel 110 according to aspects of the present disclosure.

Although not shown in FIG. 8, a respective optical sensor anode electrode 1000 may be configured to cover each of intersections of touch sensor sub-metals TSM disposed in the first diagonal direction and the touch sensor sub-metal TSM disposed in the second diagonal direction.

The optical sensor anode electrodes 1000 may be configured in a four-sided shape such as a diamond shape, square, rectangle, rhombus, or the like similar to blue emission layers EL_B. The optical sensor anode electrodes 1000 may have a size smaller than red emission layers EL_R, but have a size enough to cover the intersections of touch sensor sub-metals TSM disposed in the first diagonal direction and the touch sensor sub-metal TSM disposed in the second diagonal direction.

The optical sensor anode electrodes 1000 may be electrically connected to the touch sensor metal TSM through contact holes of the protective layer PAC.

Optical sensor intermediate layers 800 may be disposed on the optical sensor anode electrodes 1000. The optical sensor intermediate layers 800 may be disposed in areas adjacent to and overlapping with the optical sensor anode electrodes 1000.

When viewing the display panel 110 in front thereof, green emission layers EL_G may be disposed at upper and lower portions of a pixel area 500. A red emission layer EL_R may be disposed in a left portion of the pixel area 500. A blue emission layer EL_B may be disposed in a right portion of the pixel area 500. Herein, the terms "upper," "lower," "left," and "right" may be relative to each other, and therefore, be switched depending on a direction in which a user views the display panel 110 or the display device 100.

Figure 9:
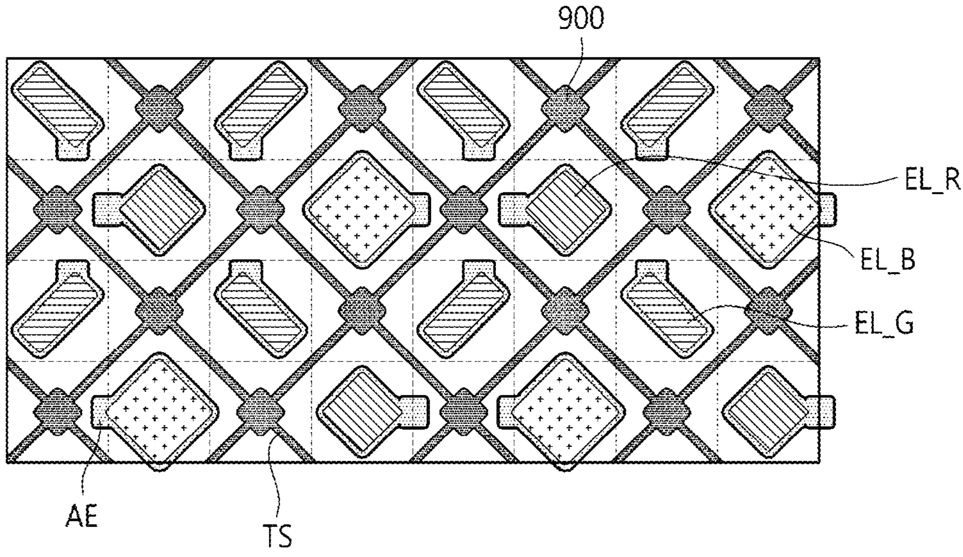

FIG. 9 illustrates an example structure in which an optical sensor cathode electrode is disposed in the display panel 110 according to aspects of the present disclosure.

The optical sensor cathode electrode 900 may be disposed on optical sensor intermediate layers 800 and disposed in areas overlapping with touch sensor sub-metals TSM of a touch sensor metal TSM. The optical sensor cathode electrode 900 may include optical sensor sub-cathode electrodes 900 disposed in a first diagonal direction and optical sensor sub-cathode electrodes 900 disposed in a second diagonal direction.

The optical sensor sub-cathode electrodes 900 disposed in the first diagonal direction may be configured to overlap with touch sensor sub-metals TSM disposed in the first diagonal direction.

The optical sensor sub-cathode electrodes 900 disposed in the second diagonal direction may be configured to overlap with touch sensor sub-metals TSM disposed in the second diagonal direction.

The optical sensor cathode electrode 900 may be disposed adjacent to optical sensor intermediate layers 800.

The optical sensor cathode electrode 900 may be configured to overlap with the optical sensor anode electrodes 1000.

According to these implementations, the optical sensor cathode electrode 900 may be configured to overlap with optical sensor intermediate layers 1000 and optical sensor intermediate layers 800 disposed in a four-sided shape such as a diamond shape, square, rectangle, rhombus, or the like in intersections of touch sensor sub-metals TSM disposed in the first diagonal direction and the touch sensor sub-metal TSM disposed in the second diagonal direction.

Although not shown in FIG. 9, an optical sensor protective layer PAC may be disposed on the optical sensor cathode electrode 900.

The optical sensor protective layer PAC may be an organic insulating layer. For example, the optical sensor protective layer PAC may include any one of an acrylic resin, polyimide resin, epoxy resin, polyamide resin, polyimide amide resin, siloxane resin, benzocyclobutene-based resin, phenol resin, and a precursor of each of these resins.

Figure 10:
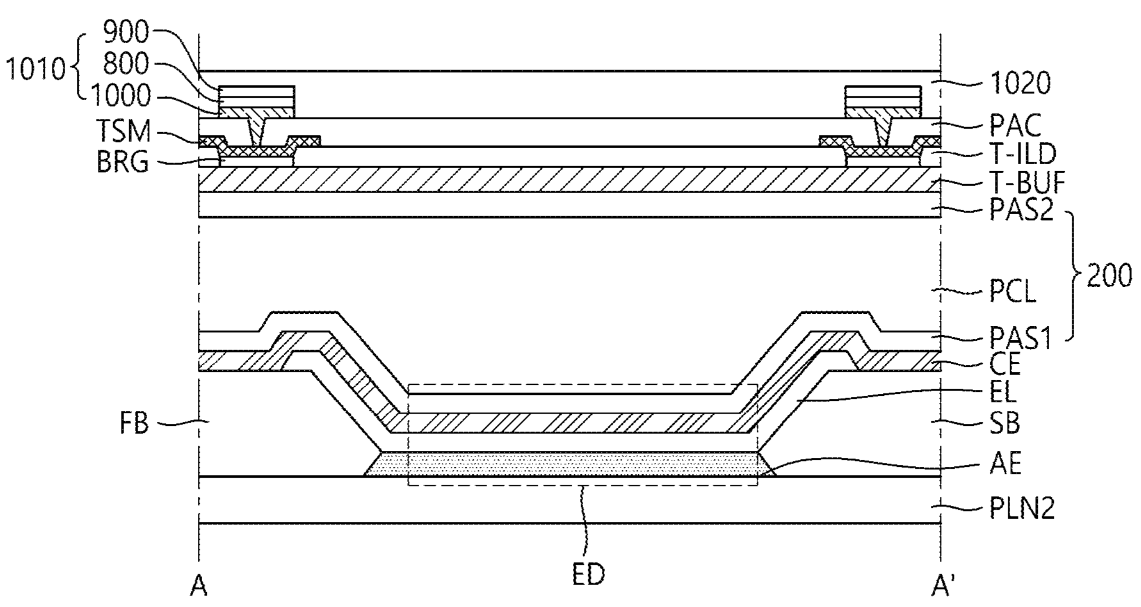
FIG. 10 is an example cross-sectional view of the display device including an optical sensor according to aspects of the present disclosure.

FIG. 10 is an example cross-sectional view of the display device 100 including an optical sensor according to aspects of the present disclosure.

FIG. 10 illustrates an example cross-sectional structure of the display panel 110 based on the structures of FIGS. 5 to 9. For example, FIG. 10 may be a cross-sectional view taken along line A-A' or a cross-sectional view taken along line B-B' of the display panel 110 of FIG. 4. Hereinafter, discussions on the illustration of FIG. 10 are provided based on the cross-sectional view taken along line A-A' of FIG. 4.

The pixel anode electrode AE may be disposed on the second planarization layer PLN2.

The bank BANK may be configured to cover a portion of the anode electrode AE. A portion of the bank BANK corresponding to a light emitting area EA of a subpixel SP may be opened.

The emission layer EL may be disposed on the pixel anode electrode AE in the opened area of the bank BANK. The pixel cathode electrode CE may be disposed on the emission layer EL. The bank BANK includes a first bank FB and a second bank SB opposite and facing the first bank FB. Here, the light emitting element ED is disposed between the first bank FB and the second bank SB from a plan view.

A light emitting element ED may be formed by the pixel anode electrodes AE, the emission layers EL, and the pixel cathode electrode CE.

The encapsulation layer (200, ENCAP) may be disposed on the pixel cathode electrode CE. The encapsulation layer (200, ENCAP) may have the same structure as the encapsulation layer (200, ENCAP) illustrated in FIG. 3.

The touch buffer layer T-BUF may be disposed on the encapsulation layer (200, ENCAP). A touch sensor TS may be disposed on the touch buffer layer T-BUF. The touch interlayer insulating layer T-ILD may be disposed between a touch sensor metal TSM and a bridge metal BRG, which are included in the touch sensor TS. A protective layer PAC may be disposed on the touch sensor TS. The protective layer PAC may include contact holes in areas that overlap with intersections of touch sensor sub-metals TSM.

The optical sensor anode electrode 1000 may be disposed on the touch sensor metal TSM. For example, the optical sensor anode electrode 1000 may be electrically connected to the touch sensor metal TSM through contact holes of the protective layer PAC.

In another example, the optical sensor anode electrode 1000 may be the same as the touch sensor metal TSM.

In some embodiments, as illustrated in FIG. 10, the optical sensor 1010 overlaps with the touch sensor metal TSM of the touch sensor TS from a plan view.

The optical sensor intermediate layer 800 may be disposed on the optical sensor anode electrode 1000.

The optical sensor cathode electrode 900 may be disposed adjacent to optical sensor intermediate layer 800. The optical sensor intermediate layer 800 may be a photoelectric device configured to generate current when receiving light.

The optical sensor protective layer PAC may be disposed on the optical sensor cathode electrode 900.

An optical sensor 1010 may be formed by the optical sensor anode electrode 1000, the optical sensor intermediate layer 800, and the optical sensor cathode electrode 900.

The optical sensor 1010 may be configured to receive external light from outside of the display panel 110. The optical sensor 1010 may generate different amounts of current depending on the characteristics of external light.

The optical sensor protective layer 1020 may be disposed on the optical sensor 1010. The optical sensor protective layer 1020 may be an organic layer. However, it is not limited thereto.

Thus, the optical sensor 1010 for sensing external light may be disposed on the touch sensor TS. As the optical sensor anode electrode 1000 of the optical sensor 1010 is electrically connected to the touch sensor metal TSM, the touch sensor metal TSM may be used as a sensor anode electrode.

In some embodiments, the optical sensor 1010 is disposed above the first bank FB and also disposed above the second bank SB from a plan view (see FIG. 10). Accordingly, as illustrated in FIG. 10, the light emitting element ED does not overlap with the optical sensor 1010 from a plan view. However, the first bank FB overlaps with the optical sensor 1010 (shown in the left of the drawing) from a plan view and the second bank SB overlaps with the optical sensor 1010 (shown in the right of the drawing) from a plan view.

In some embodiments, the optical sensor anode electrode 1000 of the optical sensor 1010 is a separate and distinct structure from the pixel anode electrode AE of the light emitting element ED (see FIG. 10).

Figure 16:
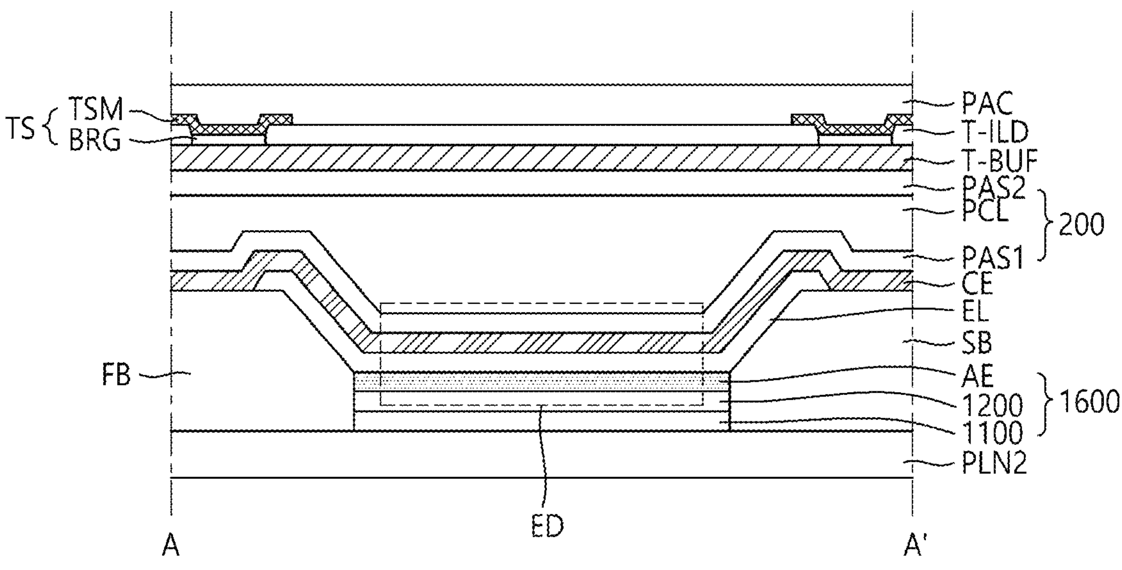
FIG. 16 is an example cross-sectional view of the display device including an optical sensor according to aspects of the present disclosure.
Figure 20:
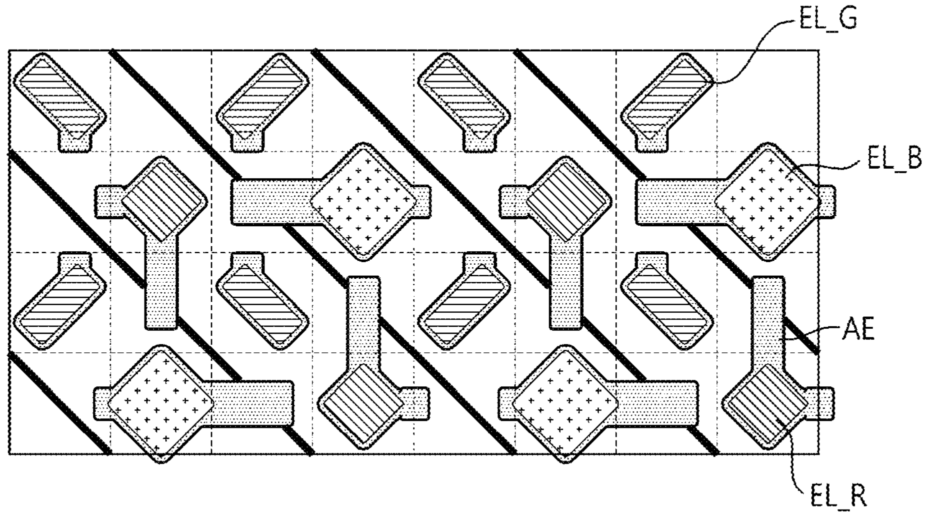

However, in other embodiments, the pixel anode electrode AE of the light emitting element ED is the optical sensor anode electrode of the optical sensor (1600 in FIGS. 16 and 2200 in FIG. 20) such that, in operation, the pixel anode electrode AE of the light emitting element ED serves as the optical sensor anode electrode of the optical sensor (1600 in FIGS. 16 and 2200 in FIG. 20).

Accordingly, as the display panel 110 has a structure where an optical sensor for sensing light is disposed in the display area DA while not reducing the number of subpixels SP in the area where the optical sensor is placed, the display panel 110 can provide an advantage of maintaining uniformly resolution across the entire display area DA.

FIGS. 11, 12, 13, 14, and 15 are example plan views of the display device including optical sensors according to aspects of the present disclosure.

Figure 11:
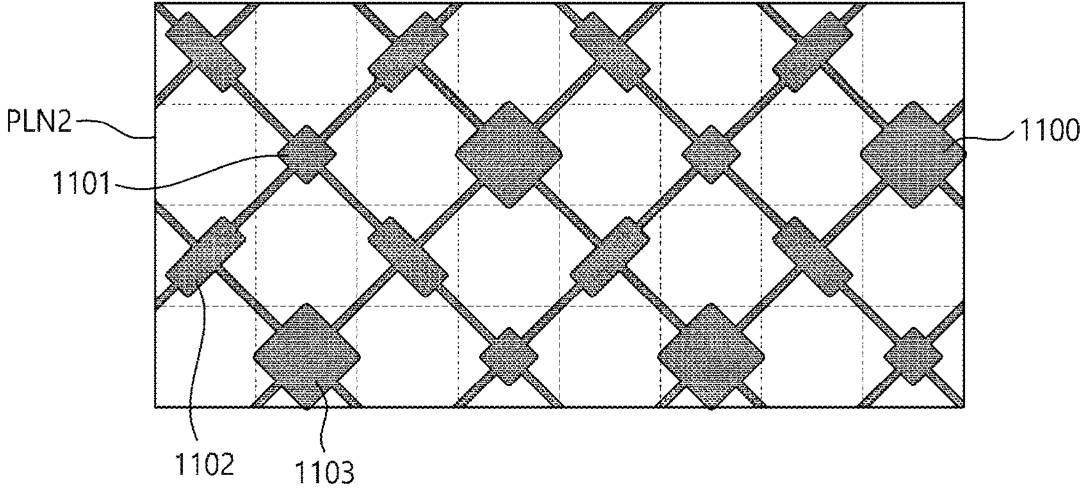
FIGS. 11, 12, 13, 14, and 15 are example plan views of the display device including optical sensors according to aspects of the present disclosure.

Referring to FIG. 11, an optical sensor cathode electrode 1100 may be disposed on a second planarization layer (e.g., the second planarization layer PLN2 of FIG. 3 discussed above).

The optical sensor cathode electrode 1100 may be patterned in the mesh configuration. Referring to FIG. 11, the optical sensor cathode electrode 1100 patterned in the mesh configuration may include optical sensor sub-cathode electrodes 1100 disposed in a first diagonal direction and optical sensor sub-cathode electrodes 1100 disposed in a second diagonal direction.

The optical sensor sub-cathode electrode 1100 disposed in the first diagonal direction and the optical sensor sub-cathode electrode 1100 disposed in the second diagonal direction may intersect each other.

The optical sensor sub-cathode electrodes 1100 may intersect each other in areas where light emitting areas EA are formed and may be configured to have areas correspond to the light emitting areas EA.

For example, a first optical sensor cathode electrode 1101 overlapping with an area where a red emission layer EL_R is disposed may have a relatively small rhombus shape. The first optical sensor cathode electrode 1101 overlaps with the red emission layer EL_R from a plan view. A second optical sensor cathode electrode 1102 overlapping with an area where a green emission layer EL_G is disposed may have a rectangular shape with a width greater than a height. The second optical sensor cathode electrode 1102 overlaps with the green emission layer EL_G from a plan view. A third optical sensor cathode electrode 1103 overlapping with an area where a blue emission layer EL_B is disposed may have a relatively large rhombus shape. The third optical sensor cathode electrode 1103 overlaps with the blue emission layer EL_B from a plan view.

As described with respect to the configuration of FIG. 7, the first diagonal direction and the second diagonal direction may directions relative to each other. For example, the first diagonal direction may be a direction from an upper left edge to a lower right edge. The second diagonal direction may be a direction from an upper right edge to a lower left edge. The first diagonal direction and the second diagonal direction may or may not be orthogonal to each other.

Herein, the terms "upper," "lower," "left," and "right" may be relative to each other, and therefore, be switched depending on a direction in which a user views the display panel 110 or the display device 100.

Figure 12:
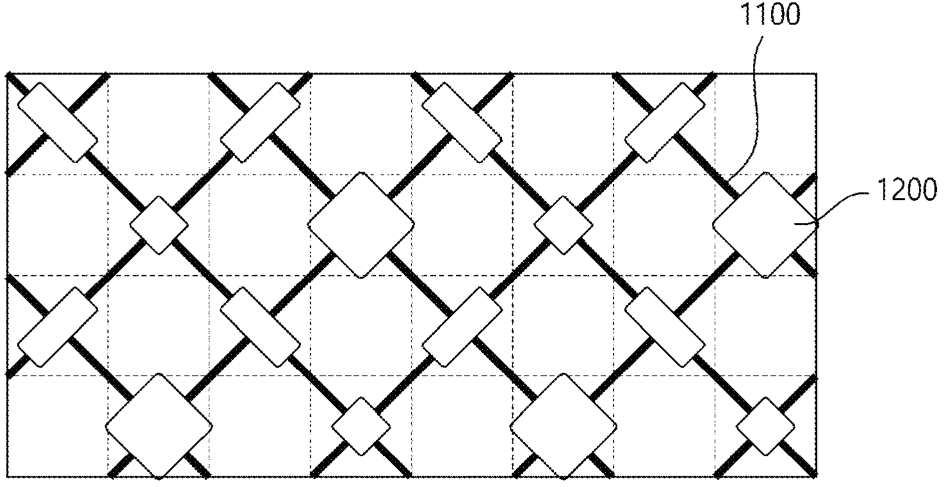

Referring to FIG. 12, optical sensor intermediate layers 1200 may be disposed on the optical sensor cathode.

The optical sensor intermediate layers 1200 may be disposed in areas corresponding to light emitting areas EA.

The optical sensor intermediate layers 1200 may be disposed in areas overlapping with the first optical sensor cathode electrode 1101, the second optical sensor cathode electrode 1102, and the third optical sensor cathode electrode 1103 of FIG. 11 described above.

Figure 13:
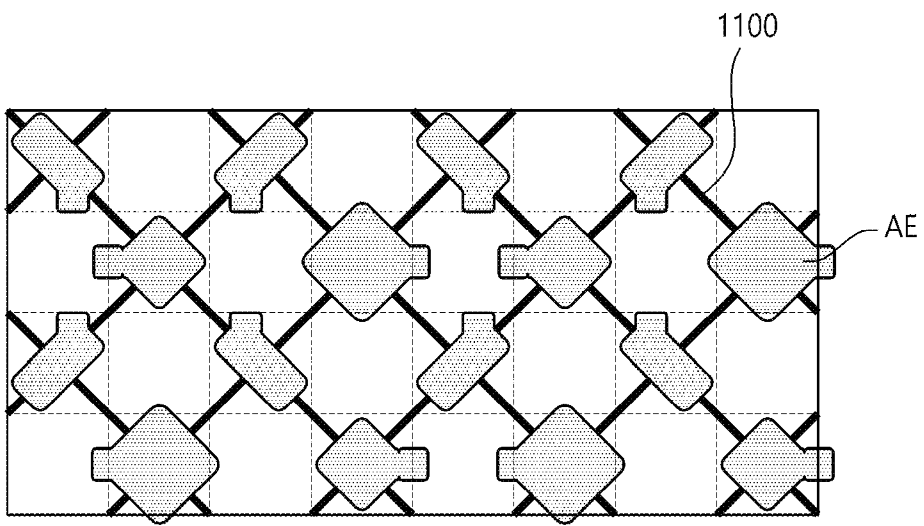

Referring to FIG. 13, pixel anode electrodes AE may be disposed on the optical sensor intermediate layers 1200.

The pixel anode electrodes AE and the optical sensor intermediate layers 1200 may be adjacent to each other and electrically connected to each other.

The pixel anode electrodes AE may include a material capable of transmitting light. For example, the pixel anode electrodes AE may include any one of an aluminum alloy or a silver alloy.

As discussed above with reference to FIGS. 11 and 12, a pixel anode electrode AE in an area where a red emission layer EL_R is disposed may have a relatively small diamond shape. A pixel anode electrode AE in an area where a green emission layer EL_G is disposed may have a rectangular shape with a width greater than a height. A pixel anode electrode AE in an area where a blue emission layer EL_B is disposed may have a relatively large rhombus shape.

Although not shown in the drawing, a bank BANK may be disposed on the pixel anode electrodes AE. Portions of the bank BANK overlapping light emitting areas EA may have openings. Accordingly, the pixel anode electrodes AE may be exposed in the opened areas of the bank BANK.

Figure 14:
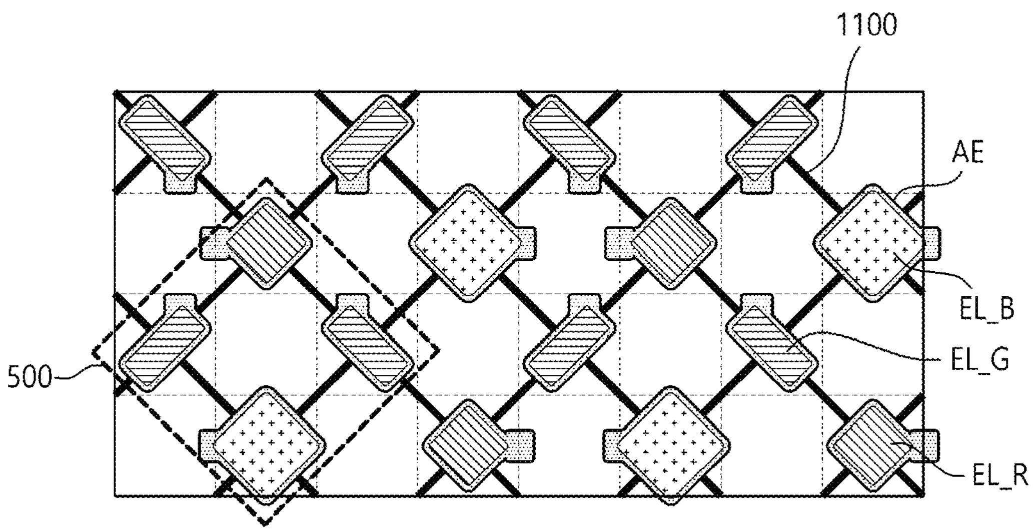

Referring to FIG. 14, emission layers EL may be disposed on the pixel anode electrodes AE.

The emission layers EL may include one or more red emission layers EL_R emitting red light, one or more green emission layers EL_G emitting green light, and one or more blue emission layers EL_B emitting blue light. Each emission layer EL may include an organic material.

A pixel area 500 of one pixel may include one red emission layer EL_R, one blue emission layer EL_B, and two green emission layers EL_G.

When the display panel 110 is viewed in front thereof, the green emission layers EL_G may be disposed at upper and lower portions of the pixel area 500. The red emission layer EL_R may be disposed in a left portion of the pixel area 500. The blue emission layer EL_B may be disposed in a right portion of the pixel area 500. Herein, the terms "upper," "lower," "left," and "right" may be relative to each other, and therefore, be switched depending on a direction in which a user views the display panel 110 or the display device 100.

It should be noted that this implementation is merely one example for discussing an example embodiment of the present disclosure, and therefore, the configuration of pixel areas 500 may vary depending on design requirements for the display device 100.

It should be noted that the foregoing description on the colors of the emission layers EL is only one example for explaining one or more example embodiments of the present disclosure. That is, colors of emission layers EL may vary depending on design requirements for the display device 100. For example, emission layers EL may further include one or more white emission layers EL_W emitting white light.

Although not shown in FIG. 14, a pixel cathode electrode CE may be disposed on the emission layers EL. A light emitting element ED may be formed by a corresponding one of the pixel anode electrodes AE, a corresponding one of the emission layers EL, and a corresponding portion of the pixel cathode electrode CE.

Figure 15:
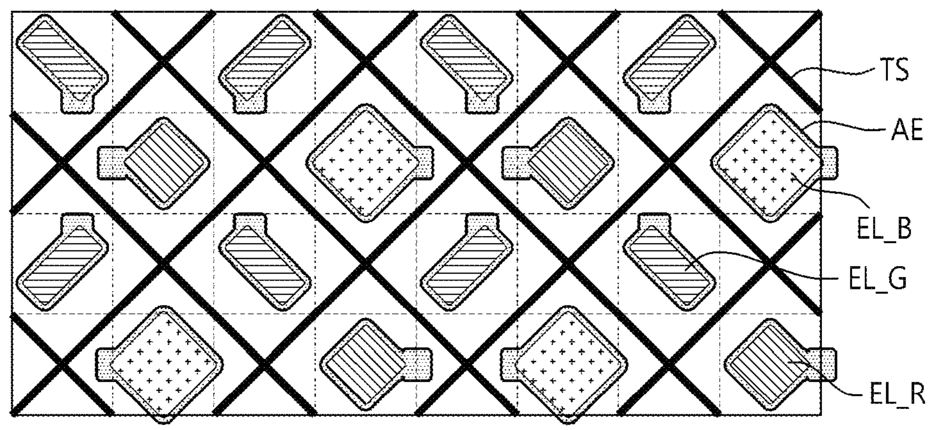

Referring to FIG. 15, although not shown in FIG. 15, an encapsulation layer (200, ENCAP) may be disposed on the pixel cathode electrodes CE. The encapsulation layer (200, ENCAP) may have a single-layer structure or a multi-layer structure. The encapsulation layer (200, ENCAP) may have the same structure as the encapsulation layer (200, ENCAP) illustrated in FIG. 3.

A touch buffer layer T-BUF may be disposed on the encapsulation layer (200, ENCAP). A touch sensor TS may be disposed on the touch buffer layer T-BUF. A touch interlayer insulating layer T-ILD may be disposed between a touch sensor metal TSM and a bridge metal BRG, which are included in the touch sensor TS.

The touch sensor metal TSM included in the touch sensor TS may be patterned in the mesh configuration, and a plurality of openings may be disposed in meshes (i.e., spaces) formed by sub-metals of the mesh-patterned touch sensor metal. The touch sensor TS shown in FIG. 15 may have the same configuration and shape as the touch sensor TS shown in FIG. 7 described above.

A protective layer PAC may be configured to cover the touch sensor TS. The protective layer PAC may be, for example, an organic insulating layer.

FIG. 16 is an example cross-sectional view of the display device 100 including an optical sensor according to aspects of the present disclosure.

For example, FIG. 16 may be a cross-sectional view taken along line A-A' or a cross-sectional view taken along line B-B' of the display panel 110 of FIG. 4. Hereinafter, discussions on the illustration of FIG. 16 are provided based on the cross-sectional view taken along line A-A' of FIG. 4.

FIG. 10 illustrates an example cross-sectional structure of the display panel 110 based on the structures of FIGS. 11 to 15.

The optical sensor cathode electrode 1100 may be disposed on the second planarization layer PLN2.

The optical sensor intermediate layer 1200 may be disposed on the optical sensor anode electrode 1100.

The pixel anode electrode AE may be disposed on the optical sensor intermediate layer 1200. The pixel anode electrode AE may include a material capable of transmitting light. For example, the pixel anode electrodes AE may include any one of an aluminum alloy or a silver alloy.

The pixel anode electrode AE and the optical sensor intermediate layer 1200 may be adjacent to each other and electrically connected to each other.

An optical sensor 1600 may be formed by the optical sensor cathode electrode 1100, the optical sensor intermediate layer 1200, and the pixel anode electrode AE. The pixel anode electrode AE may be the same as the optical sensor anode electrode AE. That is, the pixel anode electrode AE may also serve as the optical sensor anode electrode AE.

For example, the pixel anode electrode AE of the light emitting element ED and the optical sensor anode electrode AE of the optical sensor 1600 is a single and integrally formed structure formed in the same manufacturing process. Because the pixel anode electrode AE of the light emitting element ED and the optical sensor anode electrode AE of the optical sensor 1600 is shared, additional step for forming the optical sensor anode electrode AE can be omitted thereby reducing cost and improving efficiency in the manufacturing process. The pixel anode electrode AE of the light emitting element ED is the optical sensor anode electrode AE of the optical sensor 1600 such that, in operation, the pixel anode electrode AE of the light emitting element ED serves as the optical sensor anode electrode AE of the optical sensor 1600.

The bank BANK may be disposed on the pixel anode electrode AE. A portion of the bank BANK corresponding to a light emitting area EA may have an opening to expose the pixel anode electrode AE.

The emission layer EL may be disposed on the pixel anode electrode AE. The pixel cathode electrode CE may be disposed on the emission layer EL.

The emission layer EL may be disposed in an area where the optical sensor cathode electrode 1100, the optical sensor intermediate layer 1200, and the pixel anode electrode AE overlap with each other.

A light emitting element ED may be formed by the pixel anode electrodes AE, the emission layers EL, and the pixel cathode electrode CE. Further, as illustrated in FIG. 10, the optical sensor 1010 is disposed adjacent to the light emitting element ED from a plan view.

The encapsulation layer (200, ENCAP) may be disposed on the pixel cathode electrode CE. The encapsulation layer (200, ENCAP) may have the same structure as the encapsulation layer (200, ENCAP) illustrated in FIG. 3.

The touch buffer layer T-BUF may be disposed on the encapsulation layer (200, ENCAP). The touch sensor metal TSM included in the touch sensor TS may be disposed on the touch buffer layer T-BUF. The touch interlayer insulating layer T-ILD may be disposed between the touch sensor metal TSM and the bridge metal BRG, which are included in the touch sensor TS. The protective layer PAC may be disposed on the touch sensor TS.

The touch sensor metal TSM may be disposed in an area not overlapping with the optical sensor anode electrode AE.

In some embodiments, as illustrated in FIG. 16, the optical sensor 1600 does not overlap with the touch sensor metal TSM of the touch sensor TS from a plan view.

The optical sensor 1600 and the light emitting element ED may share one anode electrode AE. For example, the optical sensor anode electrode AE and the pixel anode electrode AE may be the same electrode.

For example, the optical sensor 1600 may be configured to overlap with the light emitting element ED, and the optical sensor 1600 and the light emitting element ED may share one anode electrode. Accordingly, in examples where optical sensors 1600 for sensing external light are applied in the display panel 110, the number of subpixels SP in areas where the optical sensor 1600*s* are disposed may not be reduced. Thereby, the display device 100 can provide an advantage of uniformly maintaining resolution across the entire display area DA. Further, as illustrated in FIG. 16, the optical sensor 1600 is disposed adjacent to the light emitting element ED from a plan view.

Further, in some embodiments, the optical sensor 1600 is between the first bank FB and the second bank SB from a plan view (see FIG. 16). In addition, the light emitting element ED overlaps the optical sensor 1600 from a plan view (see FIG. 16).

FIGS. 17, 18, 19, 20, and 21 are example plan views of the display device 100 including optical sensors according to aspects of the present disclosure.

Figure 17:
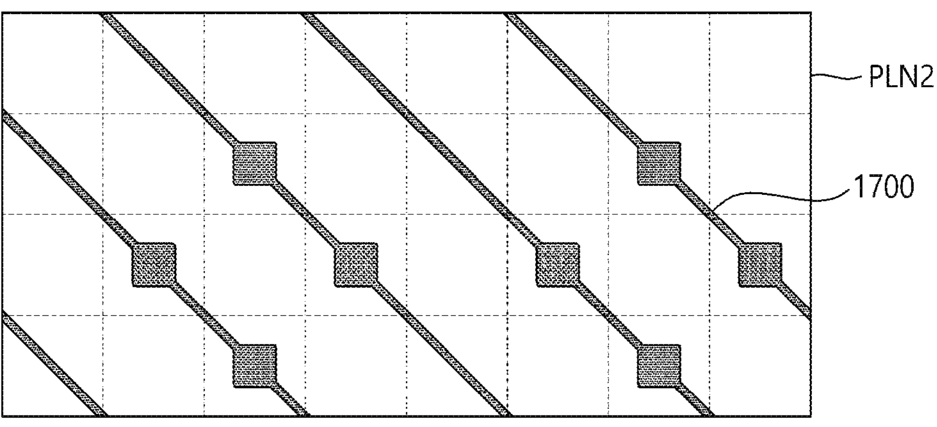
FIGS. 17, 18, 19, 20, and 21 are example plan views of the display device including optical sensors according to aspects of the present disclosure.

Referring to FIG. 17, an optical sensor cathode electrode 1700 may be disposed on a second planarization layer (e.g., the second planarization layer PLN2 of FIG. 3 discussed above).

The optical sensor cathode electrode 1700 may be disposed in a diagonal direction. For example, the diagonal direction may be a direction from an upper left edge to a lower right edge.

Herein, the diagonal direction may be a relative direction. For example, the terms "upper," "lower," "left," and "right" may be relative to each other, and therefore, be switched depending on a direction in which a user views the display panel 110 or the display device 100.

The optical sensor cathode electrode 1700 may have rectangular-shaped portions in areas where light emitting areas EA are not formed. However, example embodiments of the present disclosure are not limited thereto. For example, the optical sensor cathode electrode 1700 may have various polygon-shaped portions.

Figure 18:
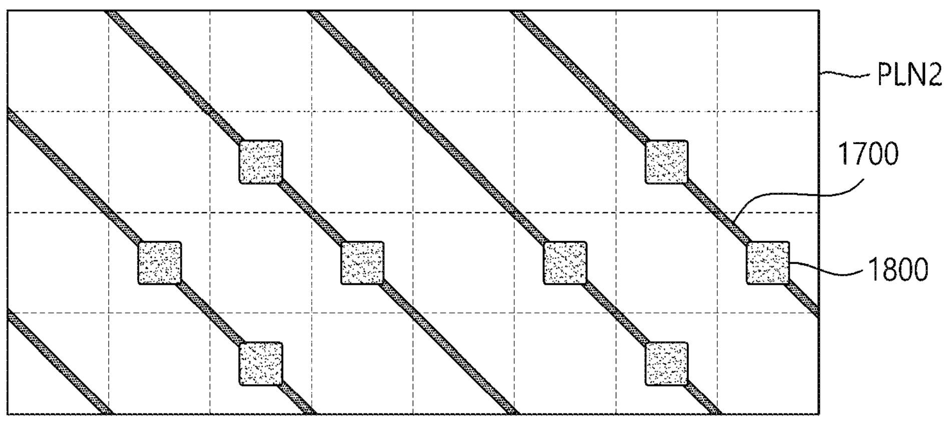

Referring to FIG. 18, optical sensor intermediate layers 1800 may be disposed on rectangular-shaped portions of the optical sensor cathode electrode 1700.

Accordingly, the optical sensor intermediate layers 1800 may be configured not to overlap with light emitting areas EA.

Figure 19:
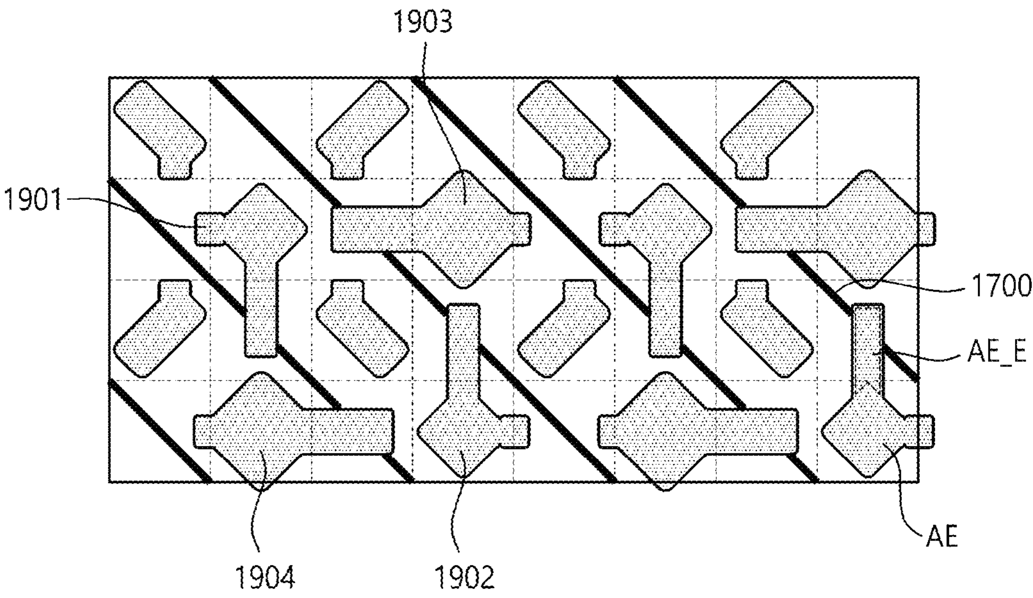

Referring to FIG. 19, pixel anode electrodes AE may be disposed on the optical sensor intermediate layers 1800.

The pixel anode electrodes AE may include a material capable of transmitting light. For example, the pixel anode electrodes AE may include any one of an aluminum alloy or a silver alloy.

In one or more aspects, the pixel anode electrodes AE may be disposed in areas where the optical sensor intermediate layers 1800 are not disposed. However, in one example, one or more of the pixel anode electrodes AE may include a respective extension portion AE_E extending in one direction.

The pixel anode electrodes AE including the extension portion may be pixel anode electrodes AE on which a red emission layer EL_R and a blue emission layer EL_B are disposed. However, this is only one example, and example embodiments of the present disclosure are not limited thereto. For example, a pixel anode electrode AE on which a green emission layer EL_G is disposed may also be extended. Herein, the terms "upper," "lower," "left," and "right" may be relative to each other, and therefore, be switched depending on a direction in which a user views the display panel 110 or the display device 100.

Pixel anode electrodes AE on which red emission layers EL_R are disposed may extend in an up or down direction when the display panel 110 is viewed in front thereof. Pixel anode electrodes AE on which blue emission layers EL_B are disposed may extend in a left or right direction when the display panel 110 is viewed in front thereof.

For example, one or more first pixel anode electrodes 1901 on which one or more red emission layers EL_R are disposed may extend in the down direction. One or more second pixel anode electrodes 1902 on which one or more red emission layers EL_R are disposed may extend in the up direction. One or more third pixel anode electrodes 1903 on which one or more blue emission layers EL_B are disposed may extend in the left direction. One or more fourth pixel anode electrodes 1904 on which one or more blue emission layers EL_B are disposed may extend in the right direction.

Extension portions AE_E of pixel anode electrodes may be configured to overlap with the optical sensor intermediate layers 1800. The extension portions AE_E of the pixel anode electrodes may be disposed adjacent to respective top surfaces of the optical sensor intermediate layers 1800.

An optical sensor may be formed by a corresponding portion of the optical sensor cathode electrode 1700, a corresponding one of the optical sensor intermediate layers 1800, and the extension portion of a corresponding one of the pixel anode electrodes AE. Here, extension portions AE_E of pixel anode electrodes may be the same as optical sensor anode electrodes AE_E. That is, the extension portions AE_E of the pixel anode electrodes may also serve as the optical sensor anode electrodes AE_E A direction in which each anode electrode AE extends may be different from each other, and for example, be any one of up, down, left, and right directions. Herein, the terms "upper," "lower," "left," and "right" may be relative to each other, and therefore, be switched depending on a direction in which a user views the display panel 110 or the display device 100.

Although not shown in FIG. 20, a bank BANK may be disposed on the pixel anode electrodes AE. Portions of the bank BANK overlapping light emitting areas EA may have openings. Accordingly, the pixel anode electrodes AE may be exposed in the opened areas of the bank BANK.

Emission layers EL may be disposed on the bank BANK. The emission layers EL may be disposed adjacent to the pixel anode electrodes AE through the openings of the bank BANK.

The emission layers EL may include one or more red emission layers EL_R emitting red light, one or more green emission layers EL_G emitting green light, and one or more blue emission layers EL_B emitting blue light. Each emission layer EL may include an organic material.

It should be noted that the foregoing description on the colors of the emission layers EL is only one example for explaining one or more example embodiments of the present disclosure. That is, colors of emission layers EL may vary depending on design requirements for the display device 100. For example, emission layers EL may further include one or more white emission layers EL_W emitting white light.

Although not shown in FIG. 20, a pixel cathode electrode CE may be disposed on the emission layers EL. A light emitting element ED may be formed by a corresponding one of the pixel anode electrodes AE, a corresponding one of the emission layers EL, and a corresponding portion of the pixel cathode electrode CE.

Although not shown in FIG. 20, an encapsulation layer (200, ENCAP) may be disposed on the pixel cathode electrode CE. The encapsulation layer (200, ENCAP) may have a single-layer structure or a multi-layer structure. The encapsulation layer (200, ENCAP) may have the same structure as the encapsulation layer (200, ENCAP) illustrated in FIG. 3.

Figure 21:
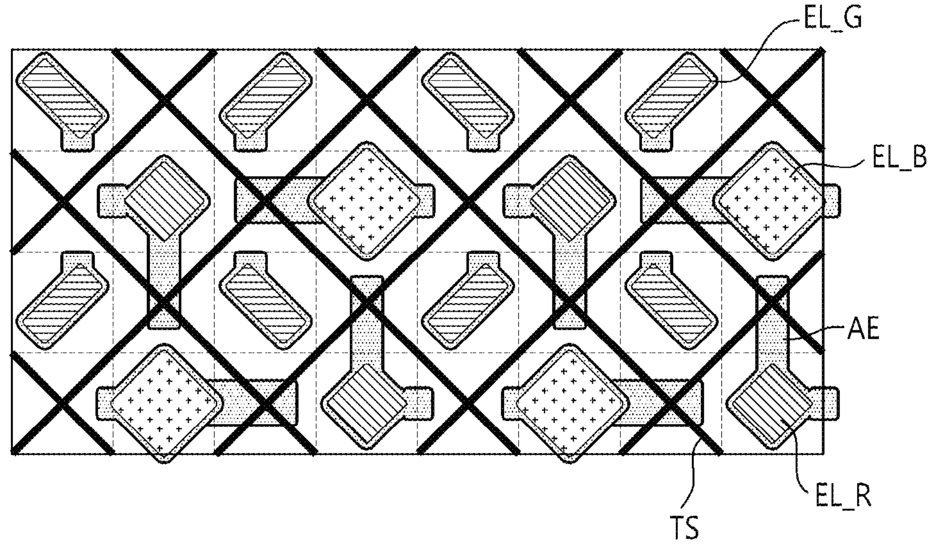

Although not shown in FIG. 21, a touch buffer layer T-BUF may be disposed on the encapsulation layer (200, ENCAP). A touch sensor TS may be disposed on the touch buffer layer T-BUF. The touch interlayer insulating layer T-ILD may be disposed between a touch sensor metal TSM and a bridge metal BRG, which are included in the touch sensor TS.

The touch sensor metal TSM included in the touch sensor TS may be patterned in the mesh configuration, and a plurality of openings may be disposed in meshes (i.e., spaces) formed by sub-metals of the mesh-patterned touch sensor metal. The touch sensor TS shown in FIG. 21 may have the same configuration and shape as the touch sensor TS shown in FIG. 7 described above.

A protective layer PAC may be configured to cover the touch sensor TS. The protective layer PAC may be, for example, an organic insulating layer.

Figure 22:
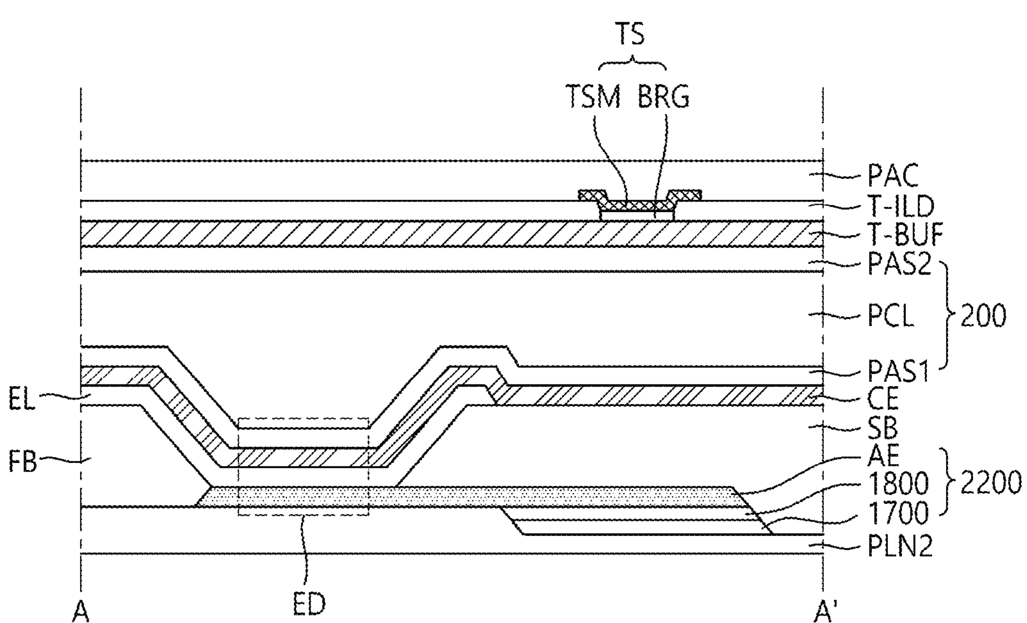
FIG. 22 is an example cross-sectional view of the display device including an optical sensor according to aspects of the present disclosure.

FIG. 22 is an example cross-sectional view of the display device 100 including an optical sensor according to aspects of the present disclosure.

For example, FIG. 22 may be a cross-sectional view taken along line A-A' or a cross-sectional view taken along line B-B' of the display panel 110 of FIG. 4. Hereinafter, discussions on the illustration of FIG. 22 are provided based on the cross-sectional view taken along line A-A' of FIG. 4.

FIG. 22 illustrates an example cross-sectional structure of the display panel 110 based on the structures of FIGS. 17 to 21.

The optical sensor cathode electrode 1700 may be disposed on the second planarization layer PLN2.

The optical sensor intermediate layer 1800 may be disposed on the optical sensor anode electrode 1700.

The pixel anode electrode AE may be disposed on the optical sensor intermediate layer 1800. In one example, one or more of pixel anode electrodes AE may include a respective extension portion AE_E extending in one direction.

The extension portion AE_E of the pixel anode electrode, the optical sensor intermediate layer 1800, and the optical sensor cathode electrode 1700 may be configured to overlap with each other. An optical sensor 2200 may be formed by the extension of the pixel anode electrode AE, the optical sensor intermediate layer 1800, and the optical sensor cathode electrode 1700. The pixel anode electrode AE may be the same as an optical sensor anode electrode AE. That is, the pixel anode electrode AE may also serve as the optical sensor anode electrode AE. Further, as illustrated in FIG. 22, the optical sensor 2200 is disposed adjacent to the light emitting element ED from a plan view.

The bank BANK may be disposed on the pixel anode electrode AE. A portion of the bank BANK overlapping a light emitting area EA may be opened. For example, the bank BANK may be configured to correspond to an area other than the light emitting area EA. Accordingly, the pixel anode electrode AE may be exposed in the opened area of the bank BANK. The extension portion AE_E of the pixel anode electrode may be covered by the bank BANK.

The emission layer EL may be disposed on the pixel anode electrode AE. The pixel cathode electrode CE may be disposed on the emission layer EL.

A light emitting element ED may be formed by the pixel anode electrode AE, the emission layer EL, and the pixel cathode electrode CE.

The encapsulation layer (200, ENCAP) may be disposed on the pixel cathode electrode CE. The encapsulation layer (200, ENCAP) may have the same structure as the encapsulation layer (200, ENCAP) illustrated in FIG. 3.

The touch buffer layer T-BUF may be disposed on the encapsulation layer (200, ENCAP). The touch sensor TS may be disposed on the touch buffer layer T-BUF. The touch interlayer insulating layer T-ILD may be disposed between a touch sensor metal TSM and a bridge metal BRG, which are included in the touch sensor TS. The protective layer PAC may be disposed on the touch sensor TS.

The touch sensor TS may be configured to overlap with an extension portion of the pixel anode electrode AE, which is configured to extend in one side direction. An optical sensor 2200 formed by the optical sensor anode electrode AE, the optical sensor intermediate layer 1800, and the optical sensor cathode electrode 1700 may be configured to overlap the touch sensor TS.

The optical sensor 2200 and the light emitting element ED may share one anode electrode AE. For example, the optical sensor anode electrode AE and the pixel anode electrode AE may be the same electrode. To further elaborate, the pixel anode electrode AE of the light emitting element ED and the optical sensor anode electrode AE of the optical sensor 2200 is a single and integrally formed structure formed in the same manufacturing process. Because the pixel anode electrode AE of the light emitting element ED and the optical sensor anode electrode AE of the optical sensor 2200 is shared, additional step for forming the optical sensor anode electrode AE can be omitted thereby reducing cost and improving efficiency in the manufacturing process. That is, the pixel anode electrode AE of the light emitting element ED is the optical sensor anode electrode AE of the optical sensor 2200 such that, in operation, the pixel anode electrode AE of the light emitting element ED serves as the optical sensor anode electrode AE of the optical sensor 2200.

Accordingly, by applying a structure where the optical sensor 2200 is configured not to overlap with the light emitting element ED, and at the same time, the extension portion of the pixel anode electrode AE of the light emitting element ED is used as the optical sensor anode electrode AE, the optical sensor 2200 can be disposed in the display panel 110 without reducing the number of subpixels SP in the display area DA. In turn, the display panel 110 can provide an advantage of maintaining uniformly resolution across the entire display area DA even when the optical sensor 2200 is disposed in the display panel 110.

Referring to FIG. 22, the pixel anode electrode AE of the light emitting element ED extends towards the second bank SB such that a portion of the pixel anode electrode AE overlaps with the second bank SB from a plan view. Further as illustrated, the pixel anode electrode AE does not extend towards the first bank FB. Therefore, the portion of the pixel anode electrode AE that extends toward the second bank SB does not overlap with the first bank FB when seen from a plan view.

Figure 23:
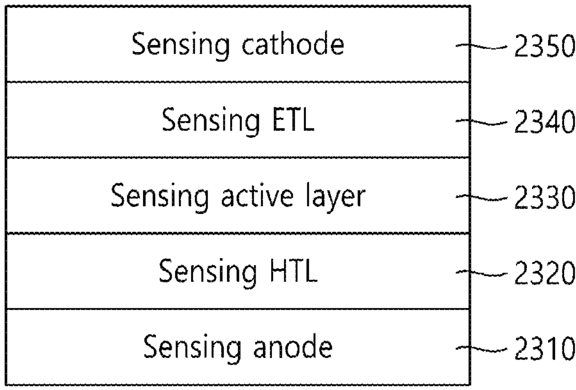
FIG. 23 illustrates an example optical sensor structure included in the display device according to aspects of the present disclosure.

FIG. 23 illustrates an example structure of an optical sensor 1010 included in the display device 100 according to aspects of the present disclosure.

The structure of the optical sensor 1010 shown in FIG. 23 may be based on the optical sensor 1010 shown in FIG. 10, but example embodiments of the present disclosure are not limited thereto. For example, the structure of the optical sensor 1010 shown in FIG. 23 may be applied to the optical sensors 1600 and 2200 shown in FIGS. 16 and 22.

The optical sensor 1010 may have a structure in which an optical sensor anode electrode 2310, an optical sensor hole transport layer 2320, an optical sensor intermediate layer 2330, an optical sensor electron transport layer 2340, and an optical sensor cathode electrode 2350 are stacked. It should be understood that for convenience of explanation, descriptions and illustrations of the light sensor electron transport layer 2340 and the light sensor hole transport layer 2320 have been omitted in the previous figures.

In one or more aspects, the optical sensor anode electrode 2310 may be electrically connected to the touch sensor metal TSM or may be the same as the touch sensor metal TSM, as described above with respect to the illustrations of FIGS. 5 to 10. In one or more aspects, the optical sensor anode electrode 2310 may be electrically connected to the pixel anode electrode AE or may be the same as the pixel anode electrode AE, as described above with respect to the illustrations of FIGS. 11 to 22.

In some embodiments, as illustrated in FIG. 22, the optical sensor 2200 overlaps with the touch sensor metal TSM (and bridge electrode BRG) of the touch sensor TS from a plan view.

In one or more aspects, the optical sensor anode electrode (2310, AE) may include a material capable of transmitting light. For example, the optical sensor anode electrodes (2310, AE) of FIGS. 11 to 22 may include aluminum alloy or silver alloy.

The optical sensor intermediate layer 2330 may include an organic material capable of generating current when receiving light. For example, the organic material included in the optical sensor intermediate layer 2330 may be a compound of poly(3-hexylthiophene-2,5-diyl) (P3HT) and [6,6]-phenyl C61-butyric acid methylester (PCBM).

The optical sensor 1010 can generate current by receiving light coming from outside of the display device 100.

For example, the optical sensor intermediate layer 2330 can be responsive to light in an infrared wavelength band. Thus, the optical sensor intermediate layer 2330 can generate a current depending on the intensity of light in the infrared wavelength band, and cause the generated current to flow through the optical sensor cathode electrode 2350. The display device 100 can sense light in the infrared wavelength band by sensing the current flowing through the optical sensor cathode electrode 2350.

Figure 24:
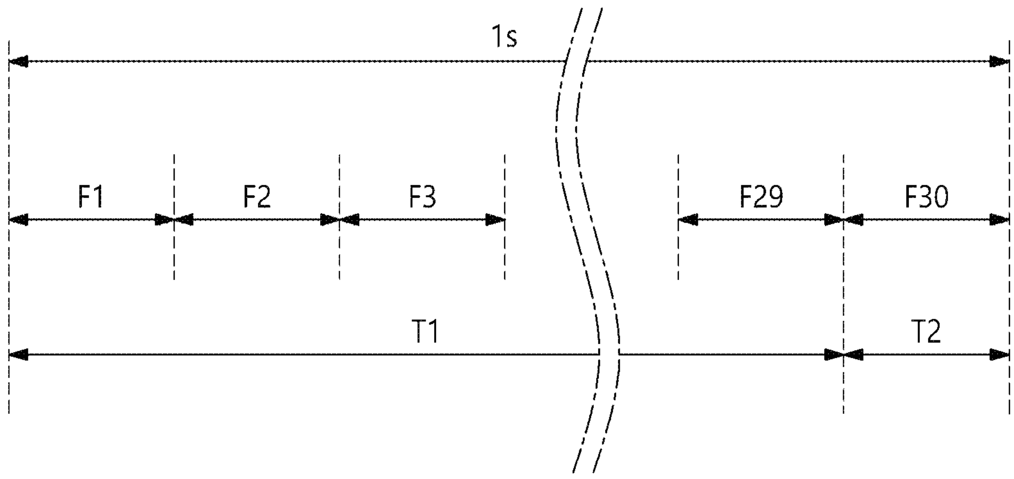
FIG. 24 illustrates operation timing of the display panel based on the configurations of FIGS. 11 to 22.

FIG. 24 illustrates operation timing of the display panel 110 based on the configurations of FIGS. 11 to 22.

Frame driving may mean how many images are present on the display panel 110 for one second (1 s). For example, when the display device 100 is driven based on 30 frames, 30 images may be present on the display panel 110 for one second (1 s).

Referring to FIG. 24, for example, the display device 100 may be driven based on 30 frames, and thus, 30 images may be present on the display panel 110 for one second (1 s).

A period during which from an image of the 1st frame F1 to an image of the 29th frame F29 are present on the display panel 110 may be referred to as a first period T1, and a period during which an image of the 30th frame F30 is present on the display panel 110 may be referred to as a second period T2.

The first period T1 may be a period during which current for causing an emission layer EL of a light emitting element ED to emit light is supplied to a pixel anode electrode AE.

The second period T2 may be a period during which current generated by an optical sensor (1600, 2200) based on incident light from outside of the display device 100 is supplied to an optical sensor cathode electrode (1100, 1800).

It should be noted that defining the first period T1 as the period from the 1st frame F1 to the 29th frame F29, and the second period T2 as the period of the 30th frame F30 is merely an example. Such period defining may be changed for smooth light sensing under a condition where image quality is not degraded.

For example, when the display device 100 is driven based on 60 frames, a first period T1 may be from the 1st frame F1 to the 55th frame F55. A second period T2 may be from the 56th frame F56 to the 60th frame F60.

The first period T1 and the second period T2 may alternate with each other at a selected rate.

For example, the optical sensors (1600, 2200) in the illustrations of FIGS. 11 to 22 may be driven by dividing frames based on a structure where each of the optical sensor anode electrodes AE and each of the pixel anode electrodes AE of the light emitting elements ED are shared. Accordingly, the optical sensors (1600, 2200) for sensing light can be disposed in the display panel 110 without reducing the number of subpixels SP in areas where the optical sensors (1600, 2200) are disposed. In turn, the display panel 110 can provide an advantage of maintaining resolution uniformly across the entire display area DA and can solve the problem of design limitations as the optical sensors (1600, 2200) are dis[posed.

The example embodiments described above will be briefly described as follows.

According to the example embodiments of the present disclosure, a display device can be provided that includes a substrate, a pixel anode electrode disposed on the substrate, an emission layer configured to overlap with the pixel anode electrode, a pixel cathode electrode configured to overlap with the emission layer, an encapsulation layer configured to cover the pixel cathode electrode, a touch sensor disposed on the encapsulation layer, and an optical sensor including an optical sensor cathode electrode disposed over the substrate, an optical sensor intermediate layer configured to overlap with the pixel cathode electrode, and an optical sensor anode electrode that is electrically connected to the touch sensor or is identical to the pixel anode electrode.

In one or more aspects, the display device may further include a contact hole disposed between the touch sensor and the optical sensor anode electrode, and the optical sensor anode electrode may be configured to contact the touch sensor through the contact hole.

In one or more aspects, the display device may further include a protective layer configured to cover the touch sensor, and an optical sensor protective layer configured to cover the optical sensor.

In one or more aspects, the optical sensor protective layer may be an organic insulating layer, and the optical sensor protective layer may include any one of an acrylic resin, polyimide resin, epoxy resin, polyamide resin, polyimide amide resin, siloxane resin, benzocyclobutene-based resin, phenol resin, and a precursor of each of these resins.

In one or more aspects, the touch sensor may include a first touch sensor pattern and a second touch sensor pattern configured to intersect the first touch sensor pattern, and the optical sensor may be configured to overlap with an area where the first touch sensor pattern and the second touch sensor pattern intersect.

In one or more aspects, the optical sensor cathode electrode may include a first optical sensor cathode electrode pattern configured to overlap with the first touch sensor pattern, and a second optical sensor cathode electrode pattern configured to overlap with the second touch sensor pattern.

In one or more aspects, the optical sensor cathode electrode may be configured to overlap with a first optical sensor anode electrode, which is the optical sensor anode electrode, and a second optical sensor anode electrode different from the first optical sensor anode electrode.

In one or more aspects, the optical sensor anode electrode may be disposed on the optical sensor cathode electrode.

In one or more aspects, the optical sensor anode electrode may be configured to overlap with the emission layer.

In one or more aspects, the optical sensor anode electrode may include any one of aluminum alloy and silver alloy.

In one or more aspects, the optical sensor anode electrode may be configured not to overlap with the touch sensor.

In one or more aspects, the optical sensor anode electrode may extend in one direction and be configured to overlap with the touch sensor.

In one or more aspects, the optical sensor may be configured to overlap with the touch sensor.

In one or more aspects, the display device may further include a bank configured to correspond to an area other than a light emitting area corresponding to the emission layer, and the bank may be disposed between the optical sensor and the touch sensor.

In one or more aspects, the optical sensor anode electrode extending in the one direction may be disposed adjacent to a top surface of the optical sensor intermediate layer.

In one or more aspects, the optical sensor intermediate layer may include an organic material, and the organic material may include a compound of poly(3-hexylthiophene-2,5-diyl) (P3HT) and [6,6]-phenyl C61-butyric acid methylester (PCBM).

In one or more aspects, the optical sensor may be configured to generate a current based on light coming from outside of the display device.

In one or more aspects, a wavelength of the light is included in an infrared wavelength band.

In one or more aspects, a period during which the current is supplied to the pixel anode electrode may include a first period during which a first current for causing the emission layer to emit light is supplied to the pixel anode electrode, and, a second period during which the current generated by the optical sensor based on the light coming from outside of the display device is supplied to the pixel anode electrode. The first period and the second period may alternate at a selected rate.

The above description has been presented to enable any person skilled in the art to make, use and practice the technical features of the present disclosure, and has been provided in the context of a particular application and its requirements as examples. Various modifications, additions and substitutions to the described embodiments will be readily apparent to those skilled in the art, and the principles described herein may be applied to other embodiments and applications without departing from the scope of the present disclosure. The above description and the accompanying drawings provide examples of the technical features of the present disclosure for illustrative purposes only. That is, the disclosed embodiments are intended to illustrate the scope of the technical features of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a substrate;

a pixel anode electrode on the substrate;

a bank disposed on the pixel anode electrode and configured to have an opening exposing a portion of a top of the pixel anode electrode;

an emission layer disposed in the opening of the bank and configured to overlap with the pixel anode electrode;

a pixel cathode electrode configured to overlap with the emission layer;

an encapsulation layer configured to cover the pixel cathode electrode;

a touch buffer layer disposed on the encapsulation layer, a touch sensor on the touch buffer layer; and an optical sensor on the substrate, wherein the encapsulation layer includes a first inorganic encapsulation layer, a second inorganic encapsulation layer, and an organic encapsulation layer disposed between the first inorganic encapsulation layer and the second inorganic encapsulation layer, wherein the touch sensor vertically overlaps with the bank and does not vertically overlap with the opening, wherein the touch buffer layer is disposed to contact with the second inorganic encapsulation layer, and wherein the optical sensor comprises:

an optical sensor cathode electrode disposed over the substrate, an optical sensor intermediate layer configured to overlap with the pixel cathode electrode, and an optical sensor anode electrode that is either electrically connected to a touch sensor metal of the touch sensor or is a single, integrally formed electrode that is the same as the pixel anode electrode.

2. The display device of claim 1, further comprising a contact hole disposed between the touch sensor and the optical sensor anode electrode, wherein the optical sensor anode electrode contacts the touch sensor through the contact hole;

a protective layer configured to cover the touch sensor; and an optical sensor protective layer configured to cover the optical sensor.

3. The display device of claim 1, wherein the touch sensor comprises a first touch sensor pattern and a second touch sensor pattern configured to intersect the first touch sensor pattern, and wherein the optical sensor is configured to overlap with an area where the first touch sensor pattern and the second touch sensor pattern intersect; and wherein the optical sensor cathode electrode comprises a first optical sensor cathode electrode pattern configured to overlap with the first touch sensor pattern, and a second optical sensor cathode electrode pattern configured to overlap with the second touch sensor pattern.

4. The display device of claim 3, wherein the optical sensor cathode electrode is configured to overlap with a first optical sensor anode electrode, which is the optical sensor anode electrode, and a second optical sensor anode electrode different from the first optical sensor anode electrode.

5. The display device of claim 1, wherein the optical sensor anode electrode is on the optical sensor cathode electrode, and wherein the optical sensor anode electrode is configured to overlap with the emission layer.

6. The display device of claim 1, wherein the optical sensor anode electrode is configured not to overlap with the touch sensor from a plan view.

7. The display device of claim 1, wherein the optical sensor anode electrode extends in one direction and is configured to overlap with the touch sensor from a plan view, and wherein the optical sensor is configured to overlap with the touch sensor from a plan view.

8. The display device of claim 7, further comprising a bank configured to correspond to an area other than a light emitting area corresponding to the emission layer, wherein the bank is disposed between the optical sensor and the touch sensor, and wherein the optical sensor anode electrode extending in the one direction is disposed adjacent to a top surface of the optical sensor intermediate layer.

9. The display device of claim 1, wherein the optical sensor intermediate layer comprises an organic material, and the organic material comprises a compound of poly (3-hexylthiophene-2,5-diyl) (P3HT) and [6,6]-phenyl C61-butyric acid methylester (PCBM).

10. The display device of claim 1, wherein a period during which the current is supplied to the pixel anode electrode comprises:

a first period during which a first current for causing the emission layer to emit light is supplied to the pixel anode electrode, and a second period during which the current generated by the optical sensor based on the light coming from outside of the display device is supplied to the pixel anode electrode, and wherein the first period and the second period alternate at a selected rate.

11. A display device, comprising:

a substrate;

a light emitting element on the substrate, the light emitting element including a first pixel electrode, a second pixel electrode, and an emission layer between the first pixel electrode and the second pixel electrode;

an encapsulation layer on the light emitting element;

a touch sensor including a touch sensor metal on the encapsulation layer; and an optical sensor on the substrate, the optical sensor including a first optical sensor electrode, a second optical sensor electrode, and an optical sensor intermediate layer between the first optical sensor electrode and the second optical sensor electrode, wherein the first optical sensor electrode is electrically connected to a touch sensor metal of the touch sensor through a contact hole of a protective layer disposed on the touch sensor.

12. The display device of claim 11, wherein the optical sensor overlaps with the touch sensor metal of the touch sensor from a plan view.

13. The display device of claim 11, further comprising a first bank and a second bank facing and opposite of the first bank, wherein the light emitting element is between the first bank and the second bank.

14. The display device of claim 13, wherein the optical sensor is between the first bank and the second bank from a plan view, and wherein the light emitting element overlaps the optical sensor from a plan view.

15. The display device of claim 13, wherein the second pixel electrode of the light emitting is on the first pixel electrode of the light emitting element, wherein the second optical sensor electrode of the optical sensor is on the first optical sensor electrode of the optical sensor, and wherein the first pixel electrode of the light emitting element and the second optical sensor electrode of the optical sensor are distinct and separate structures from each other.

16. The display device of claim 15, wherein the optical sensor overlaps with either the first bank or the second bank, and wherein the optical sensor does not overlap with the light emitting element from a plan view.

17. The display device of claim 13, wherein the second pixel electrode of the light emitting element is on the first pixel electrode of the light emitting element, and wherein the second optical sensor electrode of the optical sensor is on the first optical sensor electrode of the optical sensor.

18. The display device of claim 17, wherein either the optical sensor intermediate layer or the first optical sensor electrode does not overlap with the light emitting element from a plan view.

* * * * *